US010043895B2

(12) United States Patent
Matsuura

(10) Patent No.: US 10,043,895 B2
(45) Date of Patent: *Aug. 7, 2018

(54) SEMICONDUCTOR DEVICE

(71) Applicant: Renesas Electronics Corporation, Koutou-ku, Tokyo (JP)

(72) Inventor: Hitoshi Matsuura, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/798,209

(22) Filed: Oct. 30, 2017

(65) Prior Publication Data
US 2018/0047838 A1 Feb. 15, 2018

Related U.S. Application Data

(63) Continuation of application No. 15/390,491, filed on Dec. 24, 2016, now Pat. No. 9,842,919.

(30) Foreign Application Priority Data

Mar. 3, 2016 (JP) .................................. 2016-040904

(51) Int. Cl.
*H01L 29/66* (2006.01)
*H01L 21/8249* (2006.01)
(Continued)

(52) U.S. Cl.
CPC ...... *H01L 29/7397* (2013.01); *H01L 29/1095* (2013.01); *H01L 29/66325* (2013.01)

(58) Field of Classification Search
CPC .................................................. H01L 29/7397
(Continued)

(56) References Cited

U.S. PATENT DOCUMENTS 8,633,510 B2   1/2014   Matsuura et al.
9,041,050 B2   5/2015   Matsuura
(Continued)

FOREIGN PATENT DOCUMENTS

EP   2 942 816 A1   11/2015
EP   2 953 166 A1   12/2015
(Continued)

OTHER PUBLICATIONS

Extended European Search Report, dated May 10, 2017, for European Patent Application No. 17157913.9.

*Primary Examiner* — Calvin Lee
(74) *Attorney, Agent, or Firm* — Shapiro, Gabor and Rosenberger, PLLC

(57) ABSTRACT

A linear active cell region is formed from a plurality of divided active cell regions arranged apart from each other in a second direction (y direction). The linear hole collector cell region is formed from a plurality of divided hole collector cell regions arranged apart from each other in the second direction (y direction). A P-type floating region is formed in a semiconductor substrate between the linear active cell region and the linear hole collector cell region adjacent to each other in a first direction (x direction), between the divided active cell regions adjacent to each other in the second direction (y direction), and between the divided hole collector cell regions adjacent to each other in the second direction (y direction).

15 Claims, 20 Drawing Sheets

(51) Int. Cl.
   *H01L 29/739* (2006.01)
   *H01L 29/10* (2006.01)
(58) Field of Classification Search
   USPC .................. 438/234, 206, 189; 257/378, 370
   See application file for complete search history.

(56) References Cited

U.S. PATENT DOCUMENTS

| | | | |
|---|---|---|---|
| 9,053,954 B2 * | 6/2015 | Yasumura | ............... H01L 24/05 |
| | | | 257/378 |
| 9,368,595 B2 | 6/2016 | Matsuura | |
| 9,614,066 B2 | 4/2017 | Matsuura | |
| 9,653,587 B2 | 5/2017 | Matsuura | |
| 2012/0292662 A1 | 11/2012 | Matsuura et al. | |

FOREIGN PATENT DOCUMENTS

| | | | |
|---|---|---|---|
| JP | 2012-256839 A | 12/2012 |
| JP | 2013-140885 A | 7/2013 |

\* cited by examiner

SEMICONDUCTOR DEVICE

CROSS-REFERENCE TO RELATED APPLICATIONS

The disclosure of Japanese Patent Application No. 2016-040904 filed on Mar. 3, 2016 including the specification, drawings and abstract is incorporated herein by reference in its entirety.

The present invention relates to a semiconductor device, and can preferably be used for a power system semiconductor device, such as an IE (Injection Enhancement) type Trench Gate IGBT (Insulated Gate Bipolar Transistor), including both an active cell and an inactive cell in a direction orthogonal to the trench gate.

BACKGROUND

Japanese Unexamined Patent Application Publication No. 2012-256839 discloses an IE type trench gate IGBT. In this IGBT, each of linear unit cell regions forming the cell region is formed mainly of a linear active cell region and a linear inactive cell region. This linear active cell region is divided into an active section and an inactive section, having an emitter region, in its longitudinal direction.

Japanese Unexamined Patent Application Publication No. 2013-140885 discloses an IE type trench gate IGBT. In this IGBT, the cell formation region is configured mainly with a first linear unit cell region having a first linear unit cell region having a linear active cell region, a second linear unit cell region having a linear hole collector cell region, and a linear inactive cell region therebetween.

SUMMARY

For example, in the IE type trench gate IGBT illustrated in FIG. 33 of Japanese Unexamined Patent Application Publication No. 2012-256839, positive holes injected from the back surface electrode can be discharged only in a contact part. As a result, the accumulation effect of the positive holes is great on the surface side, and thus improving the on-voltage capability. However, the feedback capacity (capacity between the gate and the collector) is large. This brings problems that the off switching loss is large, and erroneous roll call tolerance is low.

Other objects and new features will be apparent from the descriptions of the present specification and the accompanying drawings.

A semiconductor device according to an embodiment includes a linear active cell region and a linear hole collector cell region arranged apart from each other and alternately arranged in a first direction. The linear active cell region is formed of a plurality of divided active cell regions arranged apart from each other in a second direction orthogonal to the first direction. The linear hole collector cell region is formed of a plurality of divided hole collector cell regions arranged apart from each other in the second direction. A 2-type floating region is formed over a semiconductor substrate between the linear active cell region and the linear hole collector cell region adjacent to each other in the first direction, between the divided active cell regions adjacent to each other in the second direction, and between the divided hole collector cell regions adjacent to each other in the second direction.

According to the embodiment, it is possible to realize an IE type trench gate IGBT achieving both a decrease in the on-voltage and a decrease in the feedback capacity. It is also possible to reduce the chip area.

DETAILED DESCRIPTION

Figure 1:
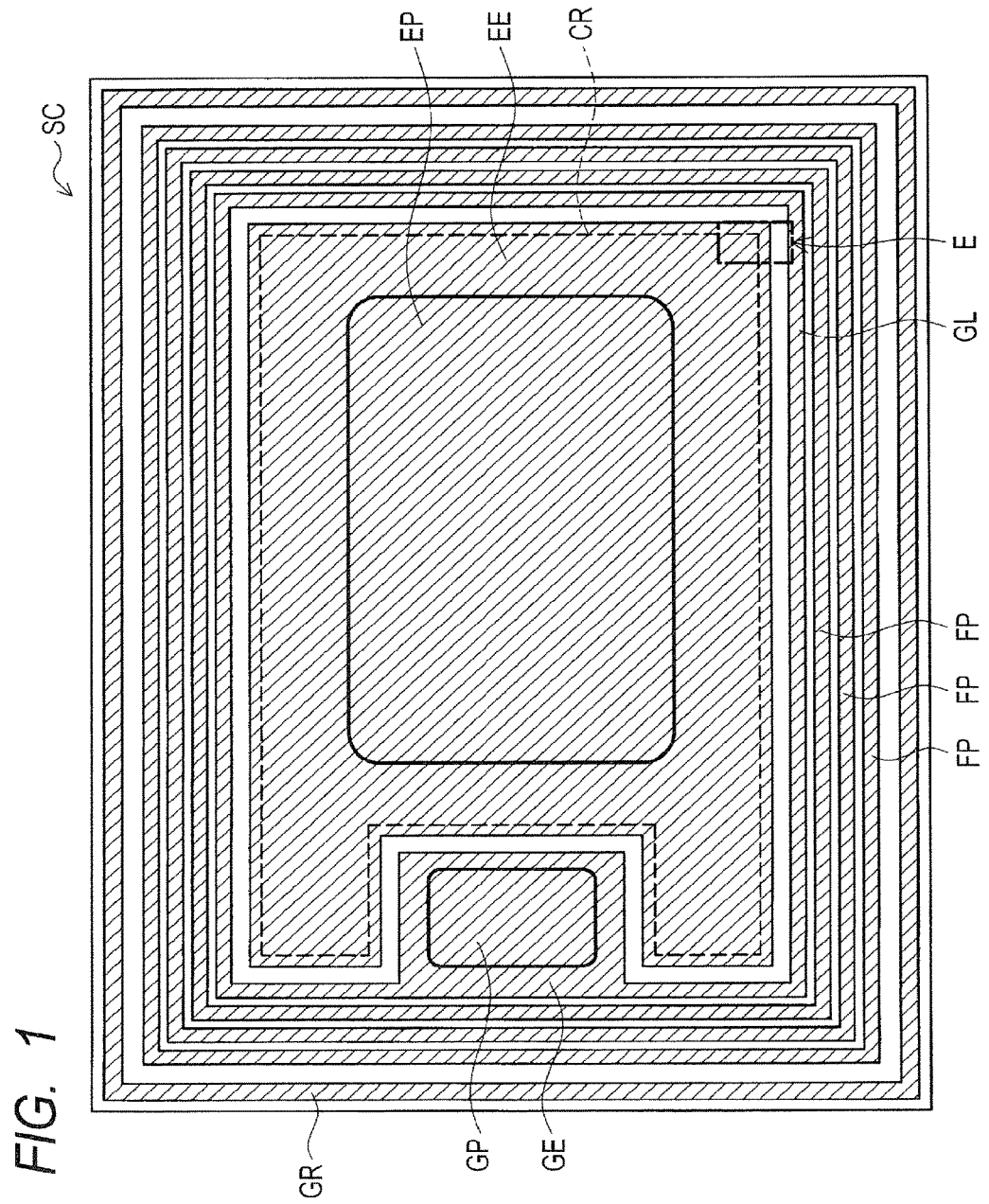
FIG. 1 is a main part plan view of a semiconductor chip included in an IE type trench gate IGBT according to an embodiment 1.

In the following preferred embodiments, if necessary for convenience sake, descriptions will be made to divided plural sections or preferred embodiments, however, unless otherwise specified, they are not mutually irrelevant, but one is in relations of modifications, details, supplementary explanations of part or whole of the other. Further, in the following preferred embodiments, in the case of reference to the number of an element (including quantity, numeric value, amount, range), unless otherwise specified and/or unless clearly limited in principle, it is not limited to the specified number, and a number over or below the specified one may be used.

In the following preferred embodiments, the constituent elements (including element steps) are not necessarily indispensable, unless otherwise specified and/or unless considered that they are obviously required in principle. Similarly, in the following preferred embodiments, in the reference of the focus of the constituent elements or the positional relationships, they intend to include those approximating or similar substantially to the forms and like, unless otherwise specified and/or unless considered that they are obviously not required in principle. This is also true of the foregoing numerical values (including quantity, numeric value, amount, range).

Descriptions will now specifically be made to the preferred embodiments based on the accompanying drawings. In all of the drawings, the same or related numerals are given to those members having the same functions, and the descriptions thereof will not be made over and over. When there exist a plurality of similar members (parts), a sign may be added to the general term to specify the individual or particular part. In the following embodiments, the same or similar parts are not described repeatedly over and over in principle except when necessary.

In the illustrations for use in the embodiments, hatching may not be given for the sake of simple illustration even in the cross sectional view. Even in the cross sectional views, hatching may be given for the sake of clear illustration.

In the cross sectional view and plan views, the size of each part does not correspond to those of the actual device, and a particular part may relatively largely be displayed. In the case where the cross sectional view and the plan view correspond to each other, some particular part may relatively and largely be displayed, for the sake of clear illustration.

The prior art techniques as the IE type trench gate IGBT are disclosed, for example, in Japanese Unexamined Patent Application Publications No. 2012-256839 and No. 2013-140885. Japanese Unexamined Patent Application Publication No. 2013-140885 discloses (1) a planar structure of a cell region and its surrounding, (2) a narrow active cell type unit cell and alternate arrangement system, and (3) an active cell two-dimensional thinning structure. Any of those overlapped parts therein will not be repeated in principle.

Embodiment 1

<Structure of IE type Trench Gate IGBT>

Figure 2:
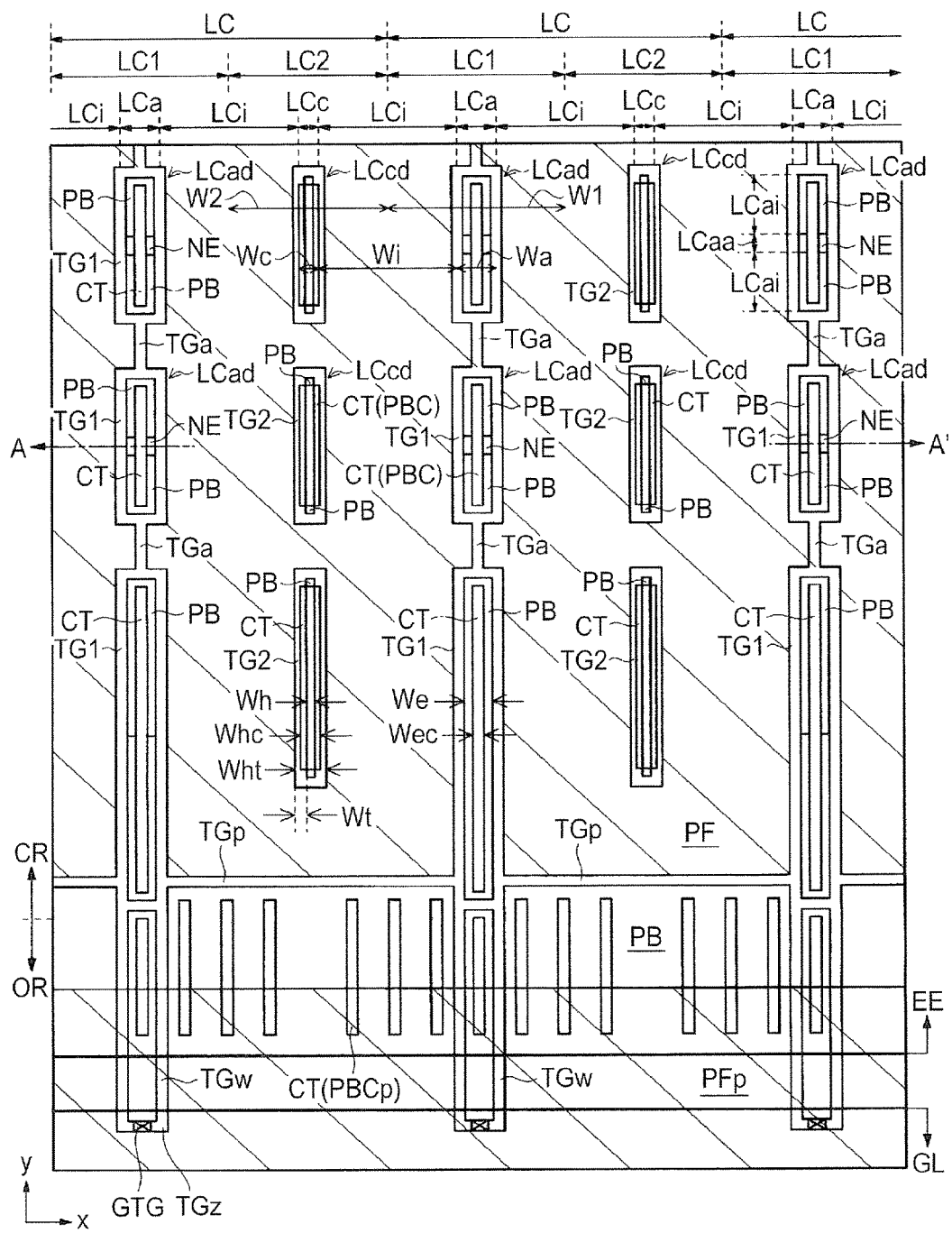
FIG. 2 is a main part plan view showing an enlarged part of an active part of the semiconductor chip according to the embodiment 1.
Figure 3:
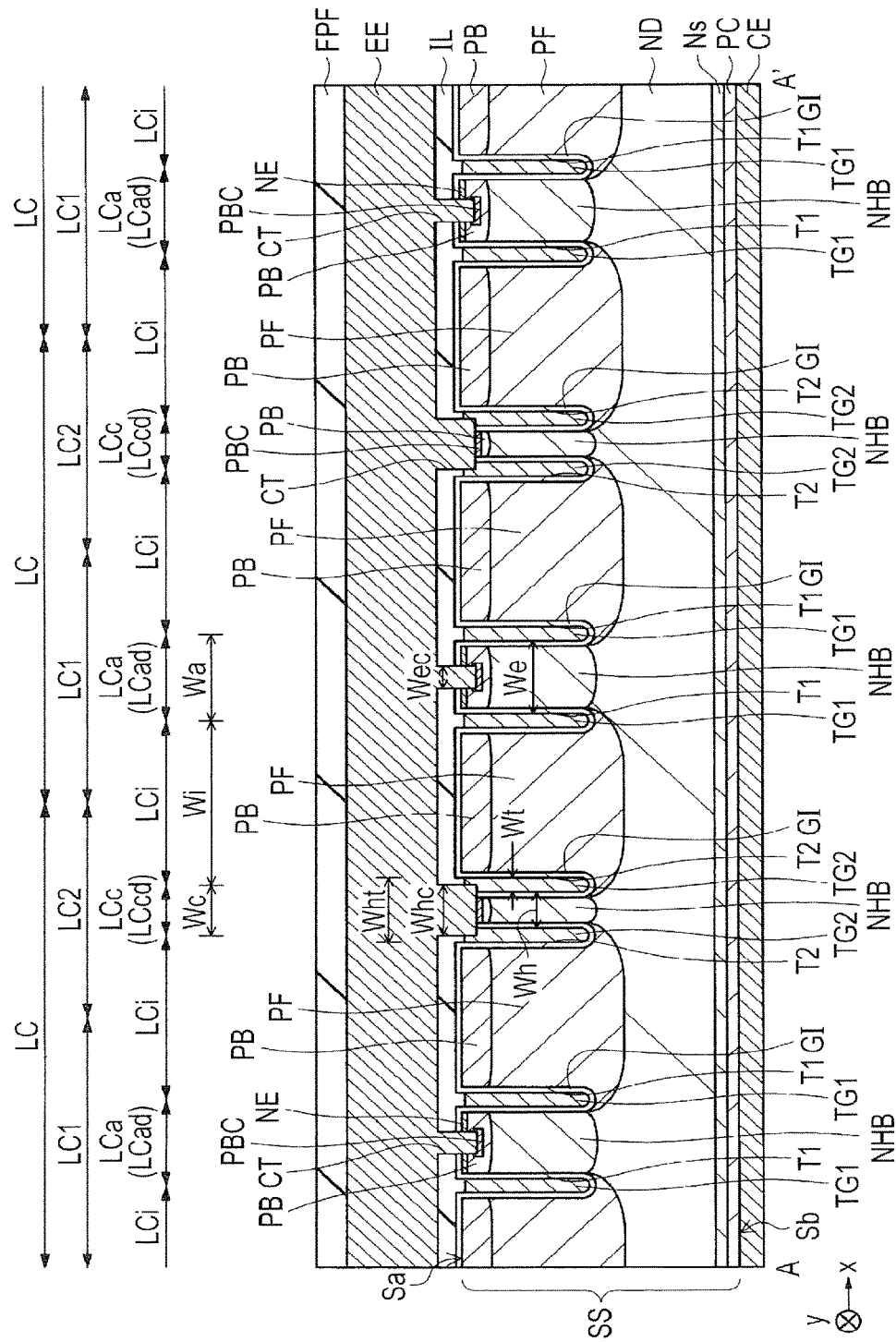
FIG. 3 is a main part cross sectional view taken along a line A-A' illustrated in FIG. 2.

Descriptions will now be made to a semiconductor device including an IE type trench gate IGBT according to the embodiment 1, using FIG. 1, FIG. 2, and FIG. 3. FIG. 1 is a main part plan view of the semiconductor chip included in the IE type trench gate IGBT according to the embodiment 1. FIG. 2 is a main part plan view showing an enlarged part of the active part of the semiconductor chip according to the embodiment 1. FIG. 3 is a main part cross sectional view of the IE type trench gate IGBT according to the embodiment 1, and is a main part cross sectional view taken along a line A-A' illustrated in FIG. 2.

As illustrated in FIG. 1, an annular guard ring GR is provided on the upper surface of the outer circumference part of a semiconductor chip SC. Inside the ring, some (single or plural) annular field plate(s) FP coupled to the annular floating field ring is provided. The guard ring GR and the field plate FP are formed of a metal film, including, for example, aluminum as the main constituent element.

Inside the annular field plate FP, and on the main part of the active part of the semiconductor chip SC, a cell formation region CR is provided. On the upper surface of the active part of the semiconductor chip SC, an emitter electrode EE is provided up to the vicinity of the outer circumference part of the semiconductor chip SC. The emitter electrode EE is formed of a metal film, including, for example, aluminum as the main constituent element. The center part of the emitter electrode EE is an emitter pad EP for coupling the bonding wire.

A gate line GL is arranged between the emitter electrode EE and the field plate FP, and the gate electrode GL is coupled to a gate electrode GE. The gate line GL and the gate electrode GE are formed of a metal film, including, for example, aluminum as the main constituent element. The center part of the gate electrode GE is a gate pad GP for coupling the bonding wire.

As illustrated in FIG. 2 and FIG. 3, in the cell formation region CR, linear unit cell regions LC are periodically arranged in a first direction (x direction). The linear unit cell regions LC are formed of first linear unit cell regions LC1 and second linear unit cell regions LC2. In this embodiment 1, a width W2 of the second linear unit cell regions LC2 is narrower than a width W1 of the first linear unit cell regions LC1.

The first linear unit cell regions LC1 are formed of a linear active cell region LCa at the center and a pair of line inactive cell regions LCi (with a half width) sandwiching both sides thereof in a first direction (x direction).

Each of the linear active cell regions LC1 is formed of a plurality of divided active cell regions LCad arranged apart from each other, in a second direction (y direction) orthogonal to the first direction (x direction).

In each divided active cell region LCad, a first trench gate electrode TG1 surrounding the entire region thereof is formed along the outer circumference part. Thus, the first trench gate electrode TG1 exists between the linear active cell region LCa and the linear inactive cell region LCi.

The first trench gate electrodes TG1 of the respective divided active cell regions LCad adjacent to each other in the second direction (y direction) are coupled to each other through a coupling trench gate electrode TGa. The first trench gate electrode TG1 and the coupling trench gate electrode TGa are electrically coupled to a gate electrode (the above-described gate electrode GE illustrated in FIG. 1).

In each divided active cell region LCad, in the first direction (x direction), there are provided a region with an N$^+$-type emitter region NE (that is, an active section LCaa) and a region (P-type body region PB) in which the N$^+$-type emitter region NE (that is, inactive sections LCai) is not formed.

Each of the second linear unit cell regions LC2 is formed of a linear hole collector cell region LCc at the center and a pair of linear inactive cell regions LCi, with a half width, sandwiching both sides of the region in the first direction (x direction).

Each of the linear hole collector cell regions LCc is formed of a plurality of divided hole collector cell regions LCcd arranged apart from each other in the second direction (y direction).

In each divided hole collector cell region LCcd, a first trench gate electrode TG2 surrounding the entire region thereof is formed along the outer circumference part. Thus, the second trench gate electrode TG2 exists between the linear hole collector cell region LCc and the linear inactive cell region LCi.

The second trench gate electrode TG2 is electrically coupled to the emitter electrode EE in a contact trench CT.

A width Wa in the first direction (x direction) of the linear active cell region LCa and a width We in the first direction (x direction) of the linear hole collector cell region LCc are narrower than a width Wi in the first direction (x direction) of the linear inactive cell region LCi. The IE type trench gate IGBT of this embodiment 1 is a so-called "narrow active cell type unit cell".

The linear active cell region LCa or the linear hole collector cell region LCc and the linear inactive cell region LCi are alternately arranged to form a linear unit cell region LC. The IE type trench gate IGBT of this embodiment 1 has a so-called "alternate arrangement system".

The contact trench CT extending along the second direction (y direction) is formed at the center part of each of the divided active cell regions LCad included in the linear active cell region LCa and the divided hole collector cell regions LCcd included in the linear hole collector cell region LCc. The lower end of the contact trench CT reaches a $P^+$-type body contact region PBC formed on a semiconductor substrate SS.

A space Wh of second trench gate electrodes TG2 adjacent to each other in the first direction (x direction) and formed in the divided hole collector cell regions LCcd is formed in the divided active cell regions LCad, and is smaller than a space We of the first trench gate electrodes TG1 adjacent to each other in the first direction (x direction) (Wh<We).

That is, the linear hole collector cell region LCc may preferably have a function for discharging positive holes injected into a P-type floating region PF. Thus, it is possible to have the smaller space Wh of the second trench gate electrodes TG2 adjacent to each other in the first direction (x direction) of the divided hole collector cell regions LCcd than the space We of the first trench gate electrodes TG1 adjacent to each other in the first direction (x direction) of the divided active cell regions LCad.

If the space Wh of the second trench gate electrodes TG2, adjacent to each other in the first direction (x direction) of the divided hole collector cell regions LCcd, is too narrow, the positive holes injected into the P-type floating region PF are less likely to be discharged. However, there is still an advantage that the carrier concentration becomes high due to accumulation of the positive holes in an $N^-$-type drift region ND, thereby decreasing the on-voltage. Therefore, the above-described space Wh is set in consideration of both the effect of the PMOS transistor and a desired on-voltage.

A width Whc in the first direction (x direction) of the contact trench CT of the divided hole collector cell region LCcd is greater than a width Wec in the first direction (x direction) of the contact trench CT of the divided active cell region LCad (Whc>Wec). For example, it is possible to form the contact trench CT of the divided hole collector cell region LCcd, in a manner that the width Whc of the contact trench CT in the divided hole collector cell region LCcd substantially becomes the same as the width We of the linear hole collector cell region LCc.

The width Whc of the contact trench Ct of the divided hole collector cell region LCcd is set smaller than a total width Wht (Wh+2*Wt) of the space Wh of the second trench gate electrodes TG2 adjacent to each other in the first direction (x direction) of the divided hole collector cell region LCcd and a width Wt of the two second trench gate electrodes TG2, and greater than the space Wh (Wht>Whc>Wh). That is, the contact trench CT of the divided hole collector cell region LCcd is formed in contact with the second trench gate electrode TG2.

However, the contact trench CT of the divided hole collector cell region LCcd is not formed in the linear inactive cell region LCi, beyond the second gate trench electrode TG2. This is to avoid that the P-type floating region PF is at an emitter potential, due to electric coupling of the emitter electrode EE and the P-type floating region PF provided in the linear inactive cell region LCi.

In the embodiment 1, the width Wc of the linear hole collector cell region LCc is formed narrower than the width Wa of the linear active cell region LCa. However, this is not essential, and it is possible that the width Wc of the linear hole collector cell region LCc is the same or substantially the same as the width Wa of the linear active cell region LCa. The same or substantially the same width brings an advantage that the positive hole distribution is uniformed.

The P-type floating region PF is provided in the linear inactive cell region LCi. Further, the P-type floating region PF is provided between the divided active cell regions LCad adjacent to each other in the second direction (y direction) of the linear active cell region LCa and between the divided hole collector cell regions LCcd adjacent to each other in the second direction (y direction) of the linear hole collector cell region LCc. Thus, the first trench gate electrode TG1 exists between the divided active cell region LCad and the P-type floating region PF, while the second trench gate electrode TG2 exists between the divided hole collector cell region LCcd and the P-type floating region PF.

In the structure of the embodiment 1, the depth of the P-type floating region PF is deeper than the lower end part of the first trench T1 and the second trench T2, to cover this lower end part. This structure is not essential. However, by this structure, there is an advantage that it facilitates maintaining a withstand voltage, even if the width Wi of the linear inactive cell region LCi is larger than the width Wa of the linear active cell region LCa.

In the embodiment 1, the width Wa of the linear active cell region LCa is narrower than the width Wi of the linear inactive cell region LCi. This structure is not essential, but can enhance the IE effect (Electron Injection Efficiency).

For example, a P-type region PFp may partially be provided in the outer circumferential part (cell circumferential junction region OR) of the cell formation region CR, to surround the cell formation region CR. Unlike any other P-type floating regions PF, a plurality of contact trenches CT are provided in this P-type region PFp. The P-type region PFp is electrically coupled to the emitter electrode EE through the plurality of contact trenches CT. The coupling of the P-type region PFp to the emitter electrode EE brings advantages that the positive holes in the P-type region PFp are discharged, unintentional potential fluctuation is suppressed, and the EMI (Electro Magnetic Interference) noise immunity increases. Note that a $P^+$-type body contact region PBCp is formed in the lower end part of the plurality of contact trenches CT.

For example, the gate line GL is arranged in the outer circumferential part of the cell formation region CR (cell circumferential junction region OR). The first trench gate electrode TG1 extends from the inside of the cell formation region CR toward this gate line GL. An end coupled trench gate electrode TGz of a part (that is, a gate lead-out unit TGw) in which the first trench gate electrode TG1 extends is electrically coupled to the gate line GL through a gate line-trench gate electrode coupling part GTG. Note that the linear inactive cell region LCi and the outer circumferential part (cell circumferential junction region OR) of the cell formation region CR are partitioned by an end trench gate electrode TGp.

Descriptions will now be made to a cross sectional structure taken along a line A-A' of FIG. 2, using FIG. 3, appropriately with reference to FIG. 1 and FIG. 2.

As illustrated in FIG. 3, the main part of the semiconductor substrate SS is occupied by an N⁻-type drift region ND. On the back surface (the second principal surface and the lower surface) Sb side of the semiconductor substrate SS, an N-type field stop region $N_s$ and a P⁺-type collector region PC are provided, from the side near to the N⁻-type drift region ND. Further, on the back surface Sb of the semiconductor substrate SS, a collector electrode CE electrically coupled to the P⁺-type collector region PC is provided.

On the surface (the first principal surface and the upper surface) Sa side of the semiconductor substrate SS, a P-type body region PB is provided on its entire surface (nearly the entire surface of the cell formation region CR).

In the linear active cell region LCa, the first trench T1 is provided on the surface Sa side of the semiconductor substrate SS, along the outer circumference of the divided active cell region LCad. Inside that, the first trench gate electrode TG1 is provided along a gate insulating film GI.

The first trench gate electrode TG1 is electrically coupled to the gate electrode (the gate electrode GE illustrated in FIG. 1). The first trench gate electrode TG1 is embedded from the lower end part up to the upper part of the first trench T1 formed in the semiconductor substrate SS.

In the linear hole collector cell region LCc, the second trench T2 is provided on the surface Sa side of the semiconductor substrate SS, along the outer circumference of the divided hole collector cell region LCcd. Inside that, the second trench gate electrode TG2 is provided through the gate insulating film GI.

The second trench gate electrode TG2 is electrically coupled to the emitter electrode EE. The second trench gate electrode TG2 is embedded from the lower end part to the upper part of the second trench T2 formed in the semiconductor substrate SS.

In the divided active cell region LCad, the N⁺-type emitter region NE is provided on the surface Sa side of the semiconductor substrate SS. The lower end part of the contact trench CT reaches the P-type body region PB, and the P⁺-type body contact region PBC is provided in the semiconductor substrate SS in contact with the lower end part of the contact trench CT. An N-type hole barrier region NHB is provided below the P-type body region PB. Note that a P⁺-type latch-up prevention region is provided below the P⁺-type body contact region PBC.

In the divided hole collector cell region LCcd, an impurity doped structure is substantially the same as the divided active cell region LCad, except that the N⁺-type is not provided. However, the lower end part of the contact trench CT reaches the second trench gate electrode TG2 in addition to the P-type body region PB, and the P⁺-type body contact region PBC is provided in the semiconductor substrate SS that the contact trench CT reaches.

Like the divided active cell region LCad, the N-type hole barrier region NHB is provided in the divided hole collector cell region LCcd. This is not essential. However, it is possible to maintain balancing of the flow of the positive holes entirely, by providing the N-type hole barrier region NHB.

In the linear inactive cell region LCi, on the surface Sa side of the semiconductor substrate SS, the P-type floating region PF deeper than, for example, the first trench T1 and the second trench T2, is provided below the P-type body region PB.

Over the nearly entire surface over the surface Sa of the semiconductor substrate SS, an interlayer insulating film IL formed of, for example, a silicon oxide film is formed. Over the interlayer insulating film IL, the emitter electrode EE formed of a metal film including mainly, for example, aluminum as a main constituent element is formed. It is coupled to the N⁺-type emitter region NE, the P-type body region PB, and the P⁺-type body contact region PBC, through the contact trench CT.

Over the emitter electrode EE, a final passivation film FPF formed of, for example, a polyimide-based organic insulating film is further formed.

<Effect of IE type Trench Gate IGBT>
1. About IE Effect

Figure 4:
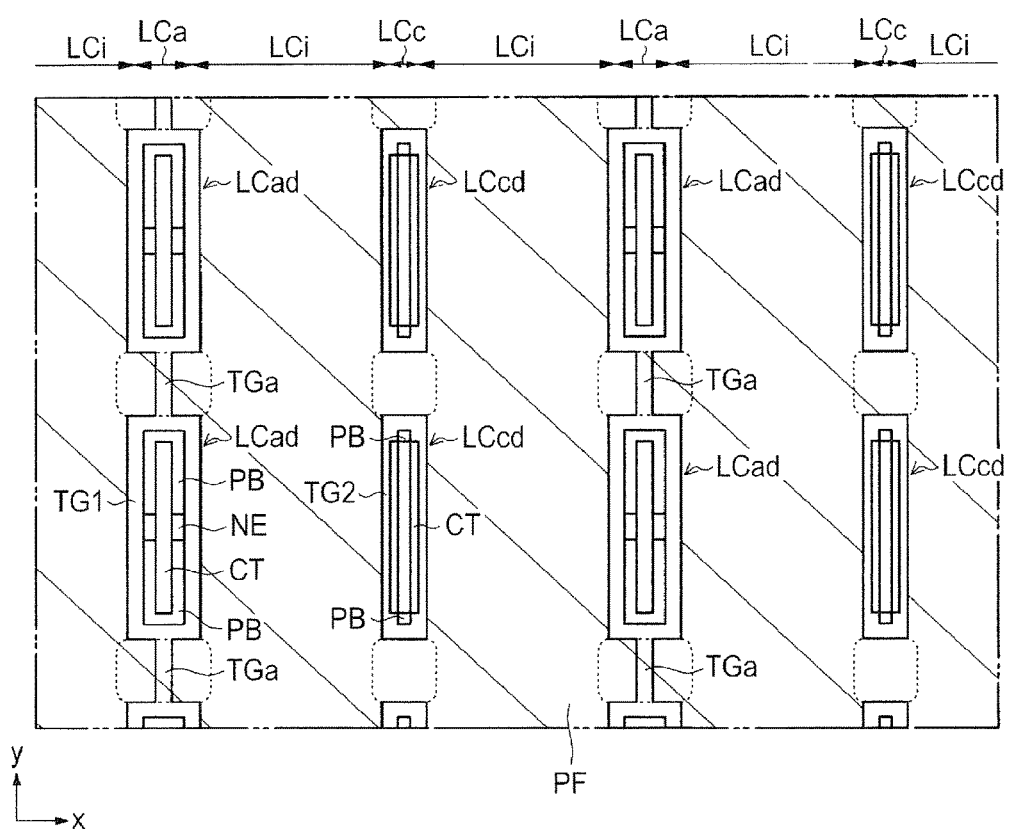
FIG. 4 is a main part plan view showing an enlarged part of a cell formation region, for explaining the first effect of the IE type trench gate IGBT according to the embodiment 1.

Descriptions will now be made to the first effect of the embodiment 1, using FIG. 4. FIG. 4 is a main part plan view showing an enlarged part of a cell formation region, for explaining the first effect of the IE type trench gate IGBT according to the embodiment 1.

As illustrated in FIG. 4, in the IE type trench gate IGBT according to the embodiment 1, the linear active cell region LCa is formed of a plurality of divided active cell regions LCad arranged apart from each other in the second direction (y direction). Similarly, the linear hole contact cell region LCc is formed of a plurality of divided hole contact cell regions LCcd arranged apart from each other in the second direction (y direction).

In addition to the linear inactive cell region LCi, the P-type floating region PF is formed between the divided active cell regions LCad adjacent to each other in the second direction (y direction) and between (region shown by a dotted line in FIG. 4) the divided hole collector cell regions LCcd adjacent to each other in the second direction (y direction).

By this structure, as compared with the IE type trench gate IGBT disclosed, for example, in FIG. 27 of Japanese Unexamined Patent Application Publication No. 2013-140885, the P-type floating region PF in plan view is formed wide, and the positive hole accumulation effect on the surface side of the semiconductor substrate increases. It is considered that this results in decreasing the on-voltage.

2. About Low Gate Capacitance

Figure 5:
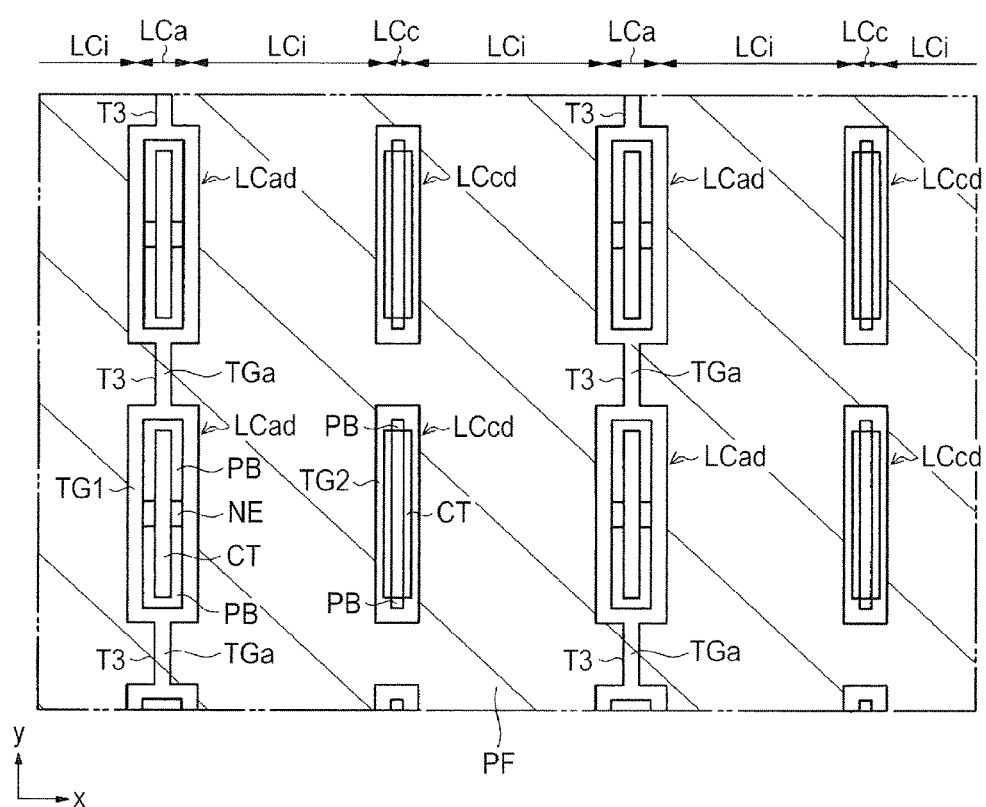
FIG. 5 is a main part plan view showing an enlarged part of the cell formation region, for explaining the second effect of the IE type trench gate IGBT according to the embodiment 1.

Descriptions will now be made to the second effect of the embodiment 1, using FIG. 5. FIG. 5 is a main part plan view showing an enlarged part of the cell formation region, for explaining the second effect of the IE type trench gate IGBT according to the embodiment 1.

As illustrated in FIG. 5, in the IE type trench gate IGBT according to the embodiment 1, the linear active cell region LCa is formed of a plurality of divided active cell regions LCad arranged apart from each other in the second direction (y direction). The first trench gate electrodes TG1 of the divided active cell regions LCad adjacent to each other in the second direction (y direction) are coupled with each other through the coupling trench gate electrode TGa.

Specifically, provided over the surface Sa side of the semiconductor substrate SS are third trenches T3 connecting to the respective first trenches T1 in the second direction (y direction) between the divided active cell regions LCad adjacent to each other in the second direction (y direction). The coupling trench gate electrode TGa is integrally formed with the corresponding first trench gate electrode TG1 through the gate insulating film GI thereinside. This coupling trench gate electrode TGa does not function as the gate of the MISFET (Metal Insulator Semiconductor Field Effect Transistor).

By this structure, as compared with the IE type trench gate IGBT disclosed, for example, in FIG. 27 of Japanese Unexamined Patent Application Publication No. 2013-140885, it is possible to lower the capacity (feedback capacity) between the gate and the collector and the capacity (input capacity) between the gate and the emitter.

There is concern about an increase in the gate resistance by the provided coupling trench gate electrode TGa. However, because the IE type trench gate IGBT does not perform a high frequency operation, it is possible to allow a certain amount of increase in the gate resistance.

3. About Positive Hole Accumulation Effect

Figure 6:
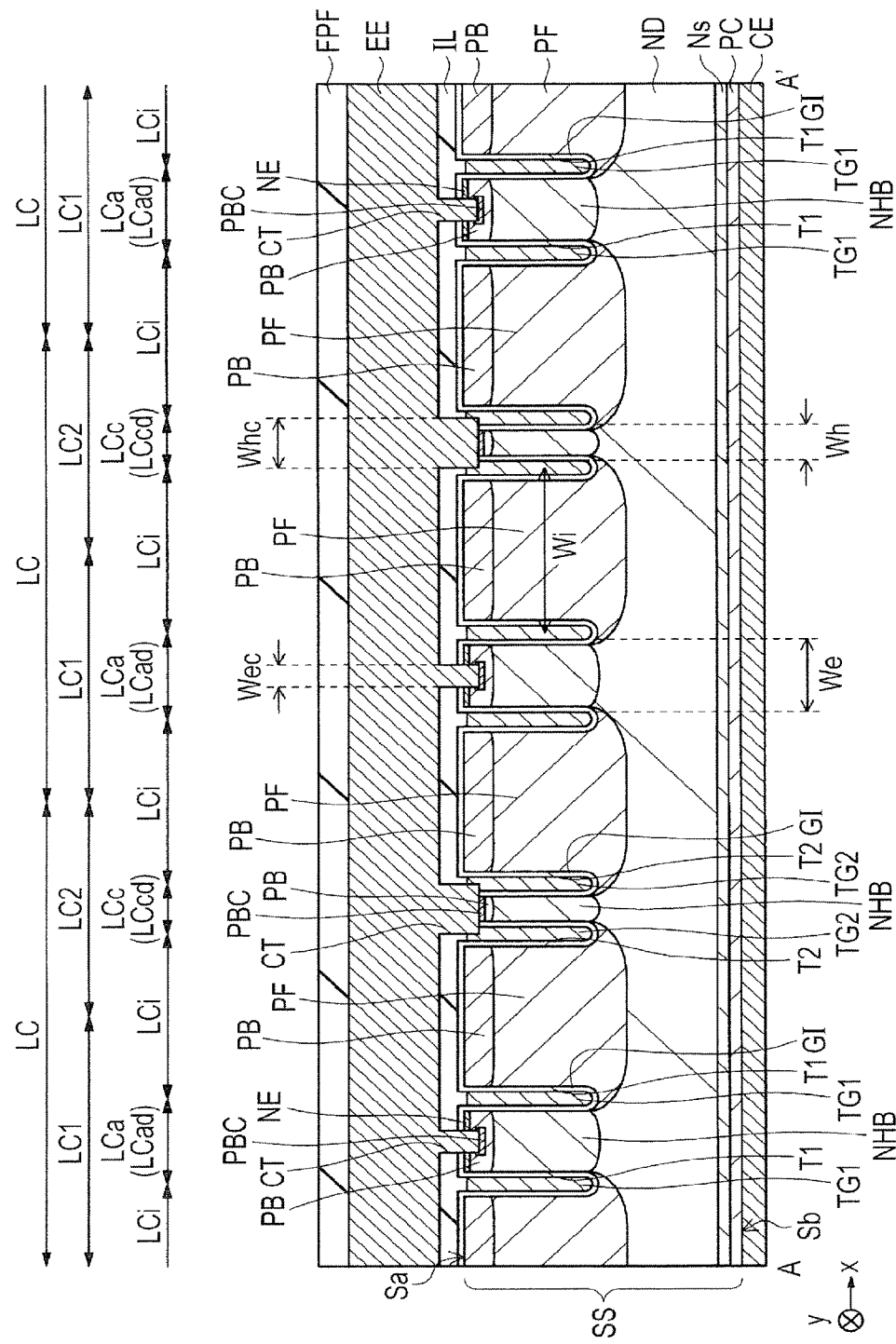
FIG. 6 is a main part cross sectional view showing an enlarged part of the cell formation region, for explaining the third effect of the IE type trench gate IGBT according to the embodiment 1.

Descriptions will now be made to the third effect of the embodiment 1, using FIG. 6. FIG. 6 is a main part cross sectional view showing an enlarged part of the cell formation region, for explaining the third effect of the IE type trench gate IGBT according to the embodiment 1.

As illustrated in FIG. 6, the space Wh of the second trench gate electrodes TG2 adjacent to each other in the first direction (x direction) and formed in the divided hole collector cell region LCcd is smaller than the space We of the first trench gate electrodes TG1 adjacent to each other in the first direction (x direction) and formed in the divided active cell region LCad (Wh<We).

When the space Wh of the second trench gate electrodes TG2 adjacent to each other in the first direction (x direction) is formed small, and when the width Wi of the linear inactive cell region LCi is formed large, without changing the width of the linear unit cell region LC, the P-type floating region PF in plan view becomes wide, and the positive hole accumulation effect on the surface Sa side of the semiconductor substrate SS is enhanced.

When the space Wh of the second trench gate electrodes TG2 adjacent to each other in the first direction (x direction) is formed small, and when the space We of the second trench gate electrodes TG2 is formed large, without changing the width of the linear unit cell region LC, the gate capacity in the linear active cell region LCa is lowered, thus enabling to improve the switching characteristic of the IE type trench gate IGBT.

There is no parasitic NPN bipolar, even if the space Wh of the second trench gate electrodes TG2 adjacent to each other in the first direction (x direction) is formed small, thus having no effect on the breakdown resistance.

Figure 7:
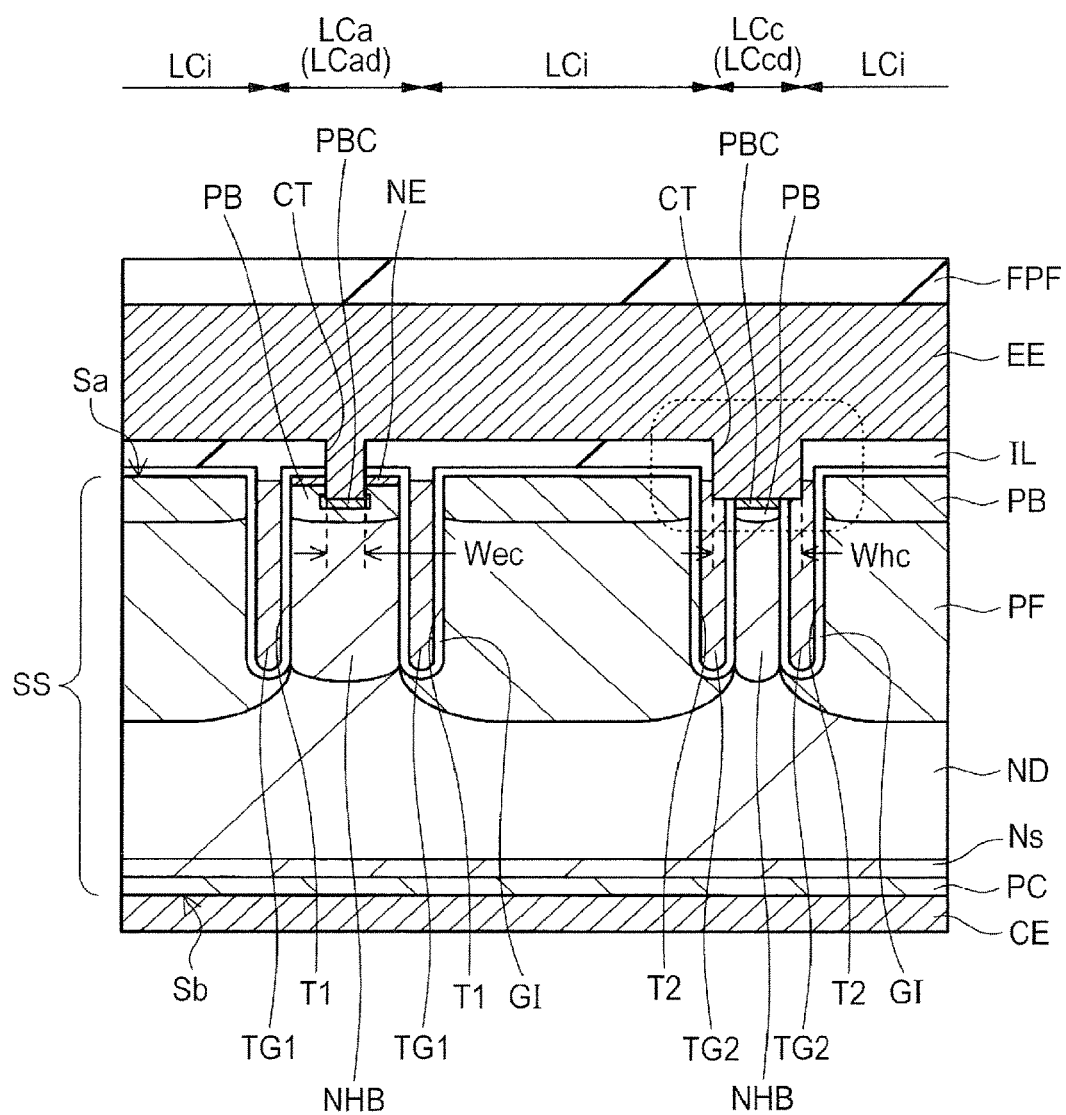
FIG. 7 is a main part cross sectional view showing an enlarged part of the cell formation region, for explaining the fourth effect of the IE type trench gate IGBT according to the embodiment 1.

4. About Processing Margin of Contact Trench in Linear Hole Collector Cell Region Descriptions will now be made to the fourth effect of the embodiment 1, using FIG. 7. FIG. 7 is a main part cross sectional view showing an enlarged part of the cell formation region, for explaining the fourth effect of the IE type trench gate IGBT according to the embodiment 1.

As illustrated in FIG. 7, the contact trench CT of the divided hole collector cell region LCcd is formed in a manner that the width Whc of the contact trench CT of the divided hole collector cell region LCcd is greater than the width Wec of the contact trench CT of the divided active cell region LCad (Whc>Wec).

Over the side of the first trench T1 of the divided active cell region LCad, because a MISFET needs to be formed in a vertical direction, it is necessary to stably form the $N^+$-type emitter region NE and the P-type body region PB with high efficiency. Thus, it is necessary to maintain a certain distance between the contact trench CT of the divided active cell region LCad and the sidewall of the first trench T1. This specific margin value depends on the processing technique of the manufacturing process and the factory management capability. It is necessary to concern that the width Wec of the contact trench CT of the divided active cell region LCad becomes too large, and that there occurs misalignment in the lithography technique for the contact trench CT and the first trench T1 of the divided active cell region LCad.

On the side of the second trench T2 of the divided hole collector cell region LCcd, because no MISFET is formed in the vertical direction, the N+-type emitter region NE is not formed. There is no need to have an alignment margin of the contact trench CT and the second trench T2 of the divided hole collector cell region LCcd. It is possible to electrically couple the two second trench gate electrodes TG2 adjacent to each other in the first direction (x direction) of the divided hole collector cell region LCcd, the P-type body region PB, and the $P^+$-type body contact region PBC, using one contact trench CT. As a result, there is no need to form the contact trench for the second trench gate electrodes TG2 and the contact trench for the P-type body region PB. Thus, this is suitable for miniaturization.

5. About Reduction of Feedback Capacity

Figure 8:
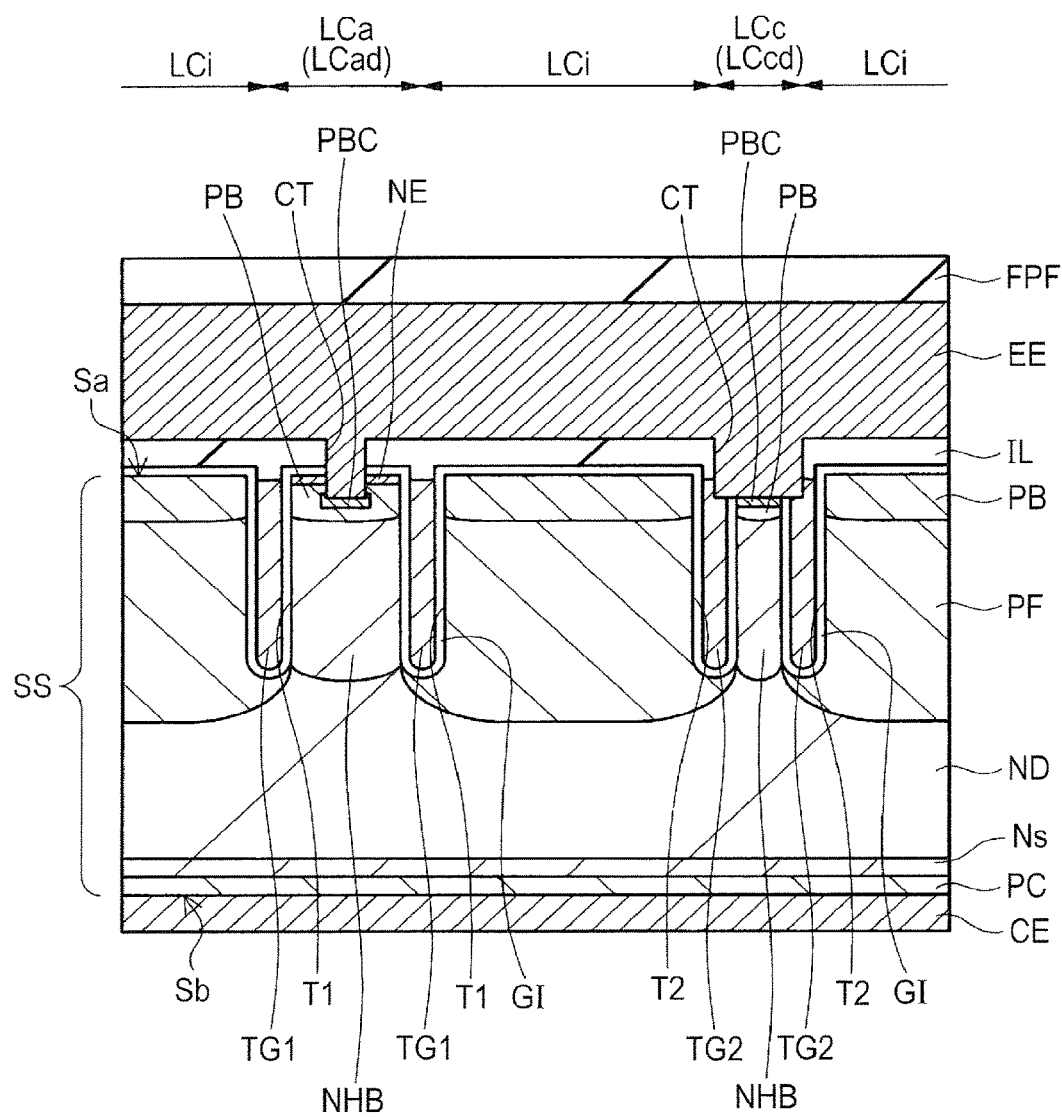
FIG. 8 is a main part cross sectional view showing an enlarged part of the cell formation region, for explaining the fifth effect of the IE type trench gate IGBT according to the embodiment 1.

Descriptions will now be made to the fifth effect of the embodiment 1, using FIG. 8. FIG. 8 is a main part cross sectional view showing an enlarged part of the cell formation region, for explaining the fifth effect of the IE type trench gate IGBT according to the embodiment 1.

As illustrated in FIG. 8, the IE type trench gate IGBT according to the embodiment 1 is a GGEE type using the second trench gate electrode TG2 coupled to the emitter electrode EE. Thus, in the divided active cell region LCad, there exists capacity $C_{GC}$ which will serve as feedback capacity (capacity between the gate and the collector) Cres. Specifically, the capacity $C_{GC}$ exists between a projecting part of the first trench gate electrode TG1 coupled to the gate electrode (the gate electrode GE illustrated in FIG. 1) from the P-type body region PB, the N-type hole barrier region NHB, and the P-type floating region PF.

$$Cres=C_{GC}$$

Thus, as compared with the IE type trench gate IGBT which is a GG type without using the second trench gate electrode TG2 coupled to the emitter electrode EE, the IE type trench gate IGBT according to the embodiment 1 can improve the switching-off loss by reduction of the feedback capacity Cres.

There exists capacity $C_{GS}$ between the first trench gate electrode TG1 and the second trench gate electrode TG2, facing each other, even it is a GGEE type using the second trench gate electrode TG2 coupled to the emitter electrode EE. Specifically, the electrode TG1 is coupled to the gate electrode (the gate electrode GE illustrated in FIG. 1), and the electrode TG2 is coupled to the emitter electrode EE. Thus, input capacity (capacity between the gate and the emitter) Cies does not really decrease.

$$Cies=C_{GS}+C_{GC}$$

That is, in the IE type trench gate IGBT according to the embodiment 1, the feedback capacity Cres can be decreased, while the input capacity Cies cannot be decreased. This implies that Cres/Cies ratio can be decreased.

One of malfunction phenomena of the inverter device is a dV/dt erroneous roll call at the time a chopper circuit is controlled to perform a switching operation. In this phenomenon, a potential difference occurs between the gate and the emitter, and the originally to-be-off IGBT turns into an on-state, by the effect of a displacement current due to a sudden change of the collector potential. A voltage Vge between the gate and the emitter is expressed by the following equation.

$$Vge = \int (Cres/Cies) dV$$

Thus, because the Cres/Cies ratio can be decreased, the voltage Vge between the gate and the emitter can be lowered. A through-current does not instantaneously flow in the off state, thus enabling to improve the erroneous roll call tolerance.

6. About Positive Holes Discharging Effect

Figure 9:
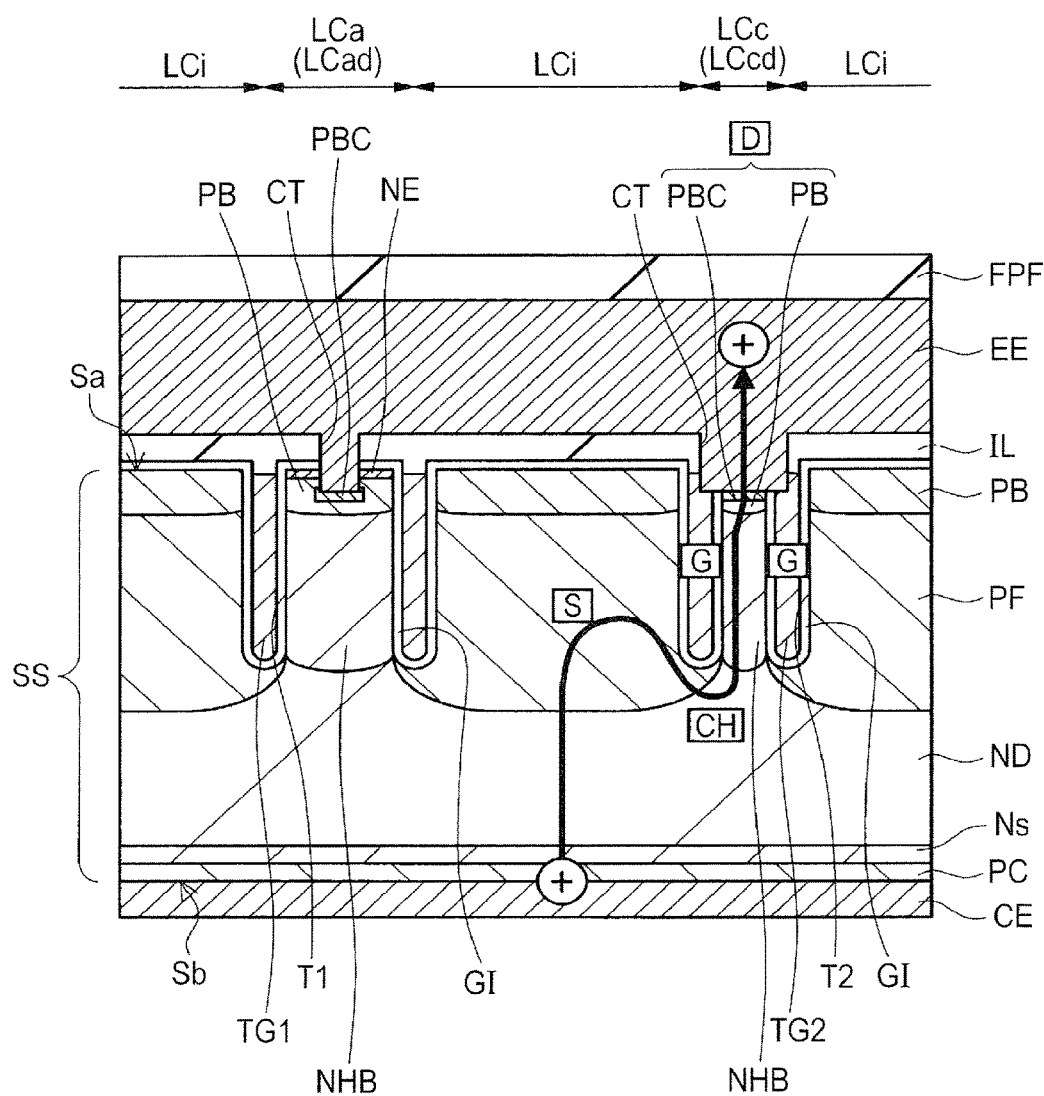
FIG. 9 is a main part cross sectional view showing an enlarged part of the cell formation region, for explaining the sixth effect of the IE type trench gate IGBT according to the embodiment 1.

Descriptions will now be made to the sixth effect of the embodiment 1, using FIG. 9. FIG. 9 is a main part cross sectional view showing an enlarged part of the cell formation region, for explaining the sixth effect of the IE type trench gate IGBT according to the embodiment 1.

As illustrated in FIG. 9, in the IE type trench gate IGBT, a parasitic PMOS transistor is formed. That is, in the formed parasitic PMOS transistor, the P-type floating region PF is formed as the source (S), the N⁻-type drift region ND and the N-type hole barrier region NHB are formed as the channel (CH), the P-type body region PB and the P⁺-type body contact region PBC are formed as the drain (D), and the second trench gate electrode TG2 formed in the divided hole collector cell region LCcd is formed as the gate (G).

Thus, if the positive holes are injected to the P-type floating region PF, the potential of the source of the parasitic PMOS transistor increases, and a minus potential difference occurs between the gate and the source of the parasitic PMOS transistor. As a result, the parasitic PMOS transistor turns on, and the positive holes injected into the P-type floating region PF are discharged to the drain of the parasitic PMOS transistor.

Accordingly, in the IE type trench gate IGBT, the positive holes injected into the P-type floating region PF are discharged from the P-type floating region PF. According to one feature, by this discharge, excessive positive holes are unlikely to be accumulated in the P-type floating region PF, in a transient state at the time of switching operation. As a result, it is possible to suppress uncontrollable potential fluctuation in the P-type floating region PF in the transient state, thus realizing excellent low noise performance.

In this manner, according to the embodiment 1, it is possible to realize the IE type trench gate IGBT achieving both a decrease in the on-voltage and a decrease in the feedback capacity.

Embodiment 2

Figure 10:
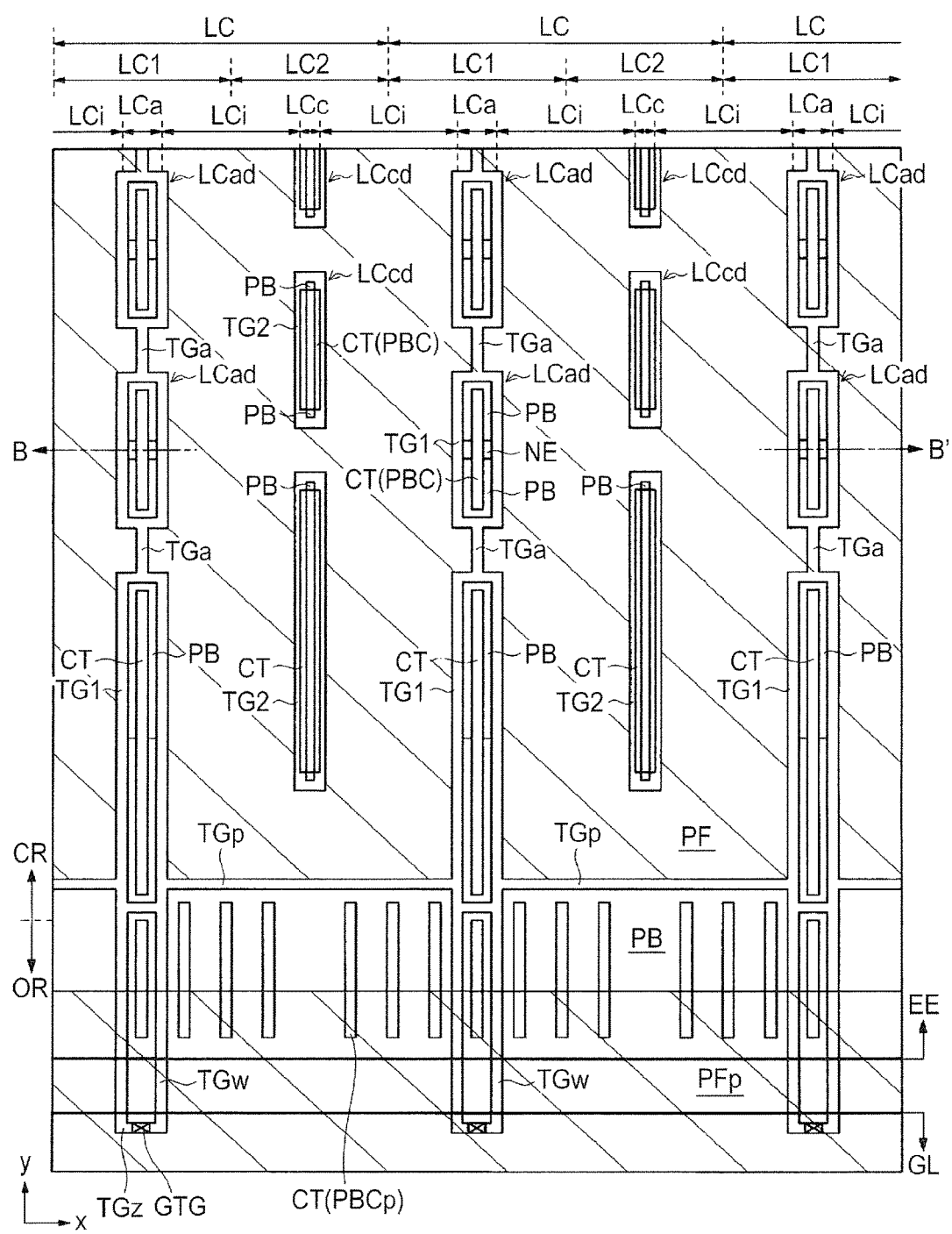
FIG. 10 is a main part plan view showing an enlarged part of an active part of a semiconductor chip according to an embodiment 2.
Figure 11:
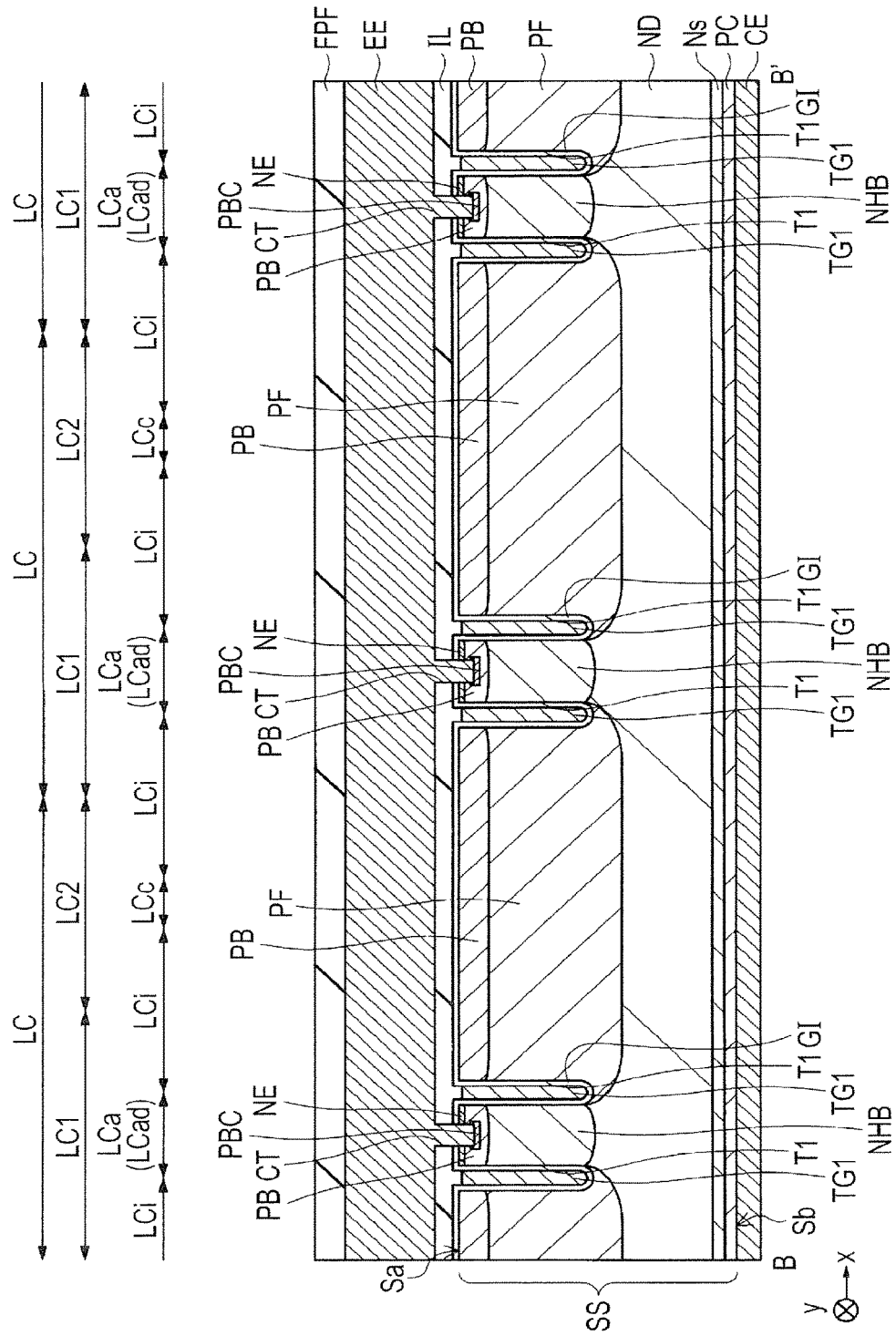
FIG. 11 is a main part cross sectional view taken along a line B-B' illustrated in FIG. 10.

Descriptions will now be made to a semiconductor device including an IE type trench gate IGBT according to an embodiment 2, using FIG. 10 and FIG. 11. FIG. 10 is a main part plan view showing an enlarged part of an active part of a semiconductor chip according to the embodiment 2. FIG. 11 is a main part cross sectional view of the IE type trench gate IGBT according to the embodiment 2, and is a main part cross sectional view taken along a line B-B' illustrated in FIG. 10.

As illustrated in FIG. 10 and FIG. 11, what differs from the IE type trench gate IGBT according to the embodiment 1 is the arrangement of the divided active cell region LCad and the divided hole collector cell region LCcd, in the IE type trench gate IGBT according to the embodiment 2.

In the IE type trench gate IGBT according to the above-described embodiment 1, the divided active cell region LCad of the linear active cell region LCa and the divided hole collector cell region LCcd of the linear inactive cell region LCi are alternately arranged, in the first direction (x direction).

That is, the divided active cell regions LCad are arranged to sandwich the linear inactive cell region LCi, on both sides in the first direction (x direction) of the divided hole collector cell region LCcd in plan view. Further, coupling trench gate electrodes TGa are arranged to sandwich the linear inactive cell region LCi, on both sides in the first direction (x direction) of the P-type floating region PF between the divided hole collector cell regions LCcd adjacent to each other in the second direction (y direction).

On the other hand, in the IE type trench gate IGBT according to the embodiment 2, as illustrated in FIG. 10 and FIG. 11, the divided active cell region LCad of the linear active cell region LCa and the divided hole collector cell region LCcd of the linear inactive cell region LCi are arranged in zigzag.

That is, the coupling trench gate electrodes TGa are positioned to sandwich the linear inactive cell region LCi, on both sides in the first direction (x direction) of the divided hole collector cell region LCcd in plan view. Further, the divided active cell regions LCad are arranged to sandwich the linear inactive cell region LCi, on both sides in the first direction (x direction) of the P-type floating region PF between the divided hole collector cell regions LCcd adjacent to each other in the second direction (y direction).

As a result, at the time of switching off, it is possible to facilitate instantaneously discharging the positive holes accumulated on the side of the surface Sa of the semiconductor substrate SS of the P-type floating region PF between the divided hole collector cell regions LCcd adjacent to each other in the second direction (y direction), from the divided active cell regions LCad on the both sides in the first direction (x direction).

In this manner, according to the embodiment 2, there is a possibility of optimizing the balance between the decreasing effect of the on-voltage and the positive-hole discharging effect at the time of switching off, in addition to the effect of the IE type trench gate IGBT according to the embodiment 1.

Embodiment 3

Figure 12:
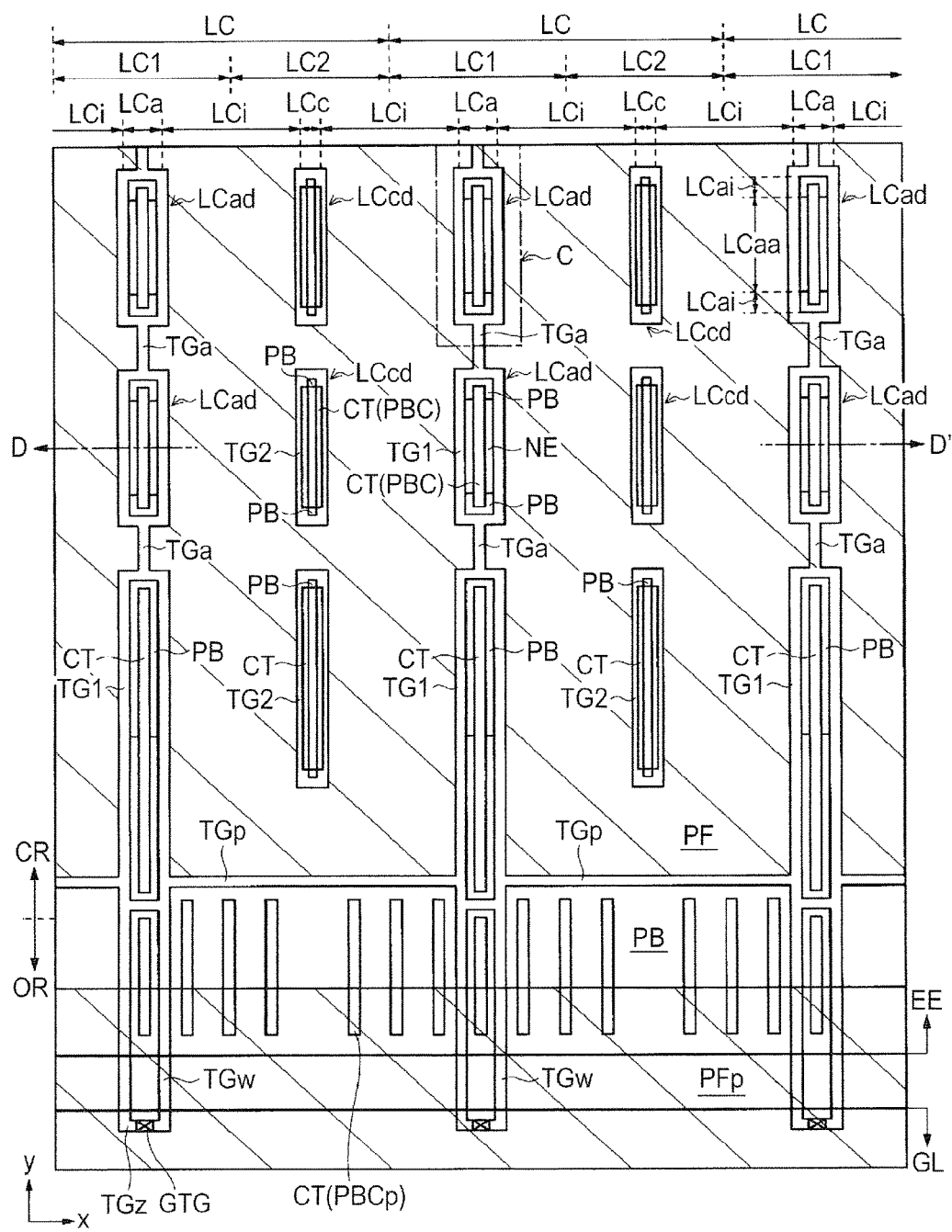
FIG. 12 is a main part plan view showing an enlarged part of an active part of a semiconductor chip according to an embodiment 3.
Figure 13:
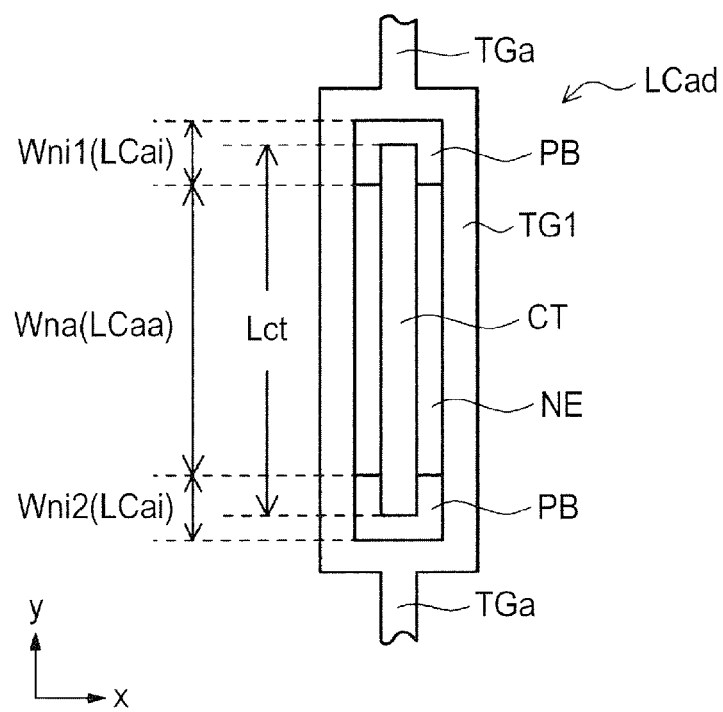
FIG. 13 is a main part plan view showing an enlarged region C illustrated in FIG. 12.
Figure 14:
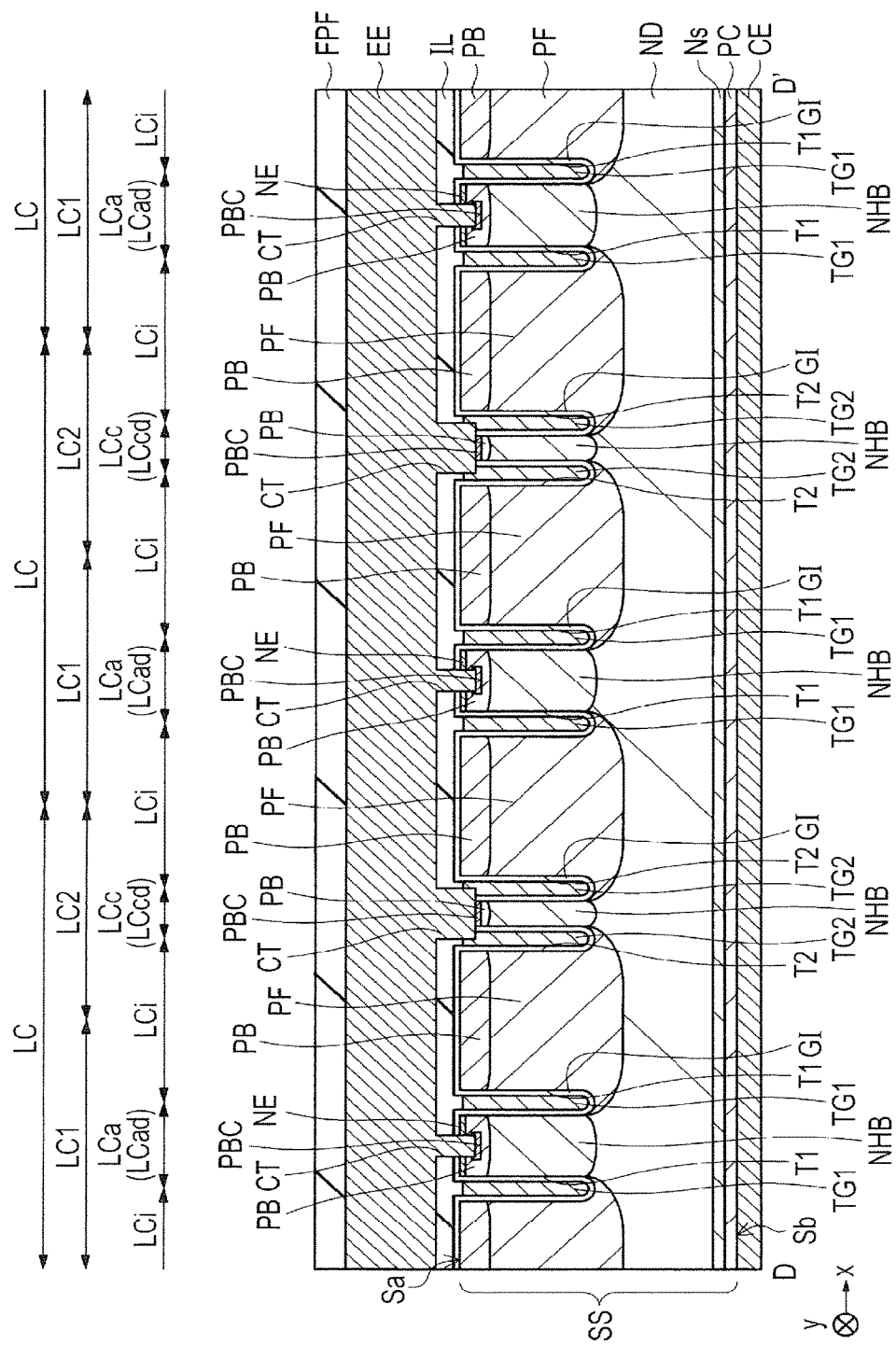
FIG. 14 is a main part cross sectional view taken along a line D-D' illustrated in FIG. 12.

Descriptions will now be made to a semiconductor device including an IE type trench gate IGBT according to an embodiment 3, using FIG. 12, FIG. 13, and FIG. 14. FIG. 12 is a main part plan view showing an enlarged part of an active part of a semiconductor chip according to the embodiment 3. FIG. 13 is a main part plan view showing an enlarged region C illustrated in FIG. 12. FIG. 14 is a main part cross sectional view of the IE type trench gate IGBT according to the embodiment 3, and is a cross sectional view taken along a line D-D' illustrated in FIG. 12.

As illustrated in FIG. 12, FIG. 13, and FIG. 14, in the IE type trench gate IGBT according to the embodiment 3, what differs from the IE type trench gate IGBT according to the embodiment 1 is the width of the N+-type emitter region NE, in the second direction (y direction), formed in the divided active cell region LCad of the linear active cell region LCa.

In the divided active cell region LCad of the above-described IE type trench gate IGBT according to the embodiment 1, in the second direction (y direction), the width of the N+-type emitter region NE (that is, the active section LCaa) is smaller than the width of the region (P-type body region PB) where the N+-type emitter region NE (that is, the inactive section LCai) is not formed, that is, the inactive section LCai.

On the other hand, in the divided active cell region LCad of the IE type trench gate IGBT according to the embodiment 3, a width Wna of the active section LCaa (N+-type emitter region NE) is greater than a width (Wni1+Wni2) of the inactive section LCai (the region where the N+-type emitter region NE (P-type body region PB) is not formed) (Wna>(Wni1+Wni2)). It is possible to increase a saturation current flowing in a state where a gate voltage is applied, by making the N+-type emitter region NE larger. Note that any one of the width Wni1 and the width Wni2 may be zero. That is, one P-type body region PB may not necessarily be formed.

The width Wna in the second direction (y direction) of the N+-type emitter region NE is smaller than a length Lct in the second direction (y direction) of the contact trench CT, and is provided in a manner that the end part of the N+-type emitter region NE is positioned more inside than the end part of the contact trench CT.

If the circumference of the contact trench CT is enclosed by the N+-type emitter region NE in plan view, in a process where the positive holes coming from the peripheral part flow to the contact trench CT (the emitter electrode EE), most of them contribute as a base current of the NPN parasitic bipolar. Thus, the NPN parasitic bipolar easily operates. If the NPN parasitic bipolar undesirably operates, it cannot be controlled by a gate voltage of the MISFET. There is concern about occurrence of a problem that the IE type trench gate IGBT is damaged.

In this manner, according to the embodiment 3, it is possible to increase the saturation current, in addition to the effect of the above-described IE type trench gate IGBT according to the embodiment 1.

Embodiment 4

Figure 15:
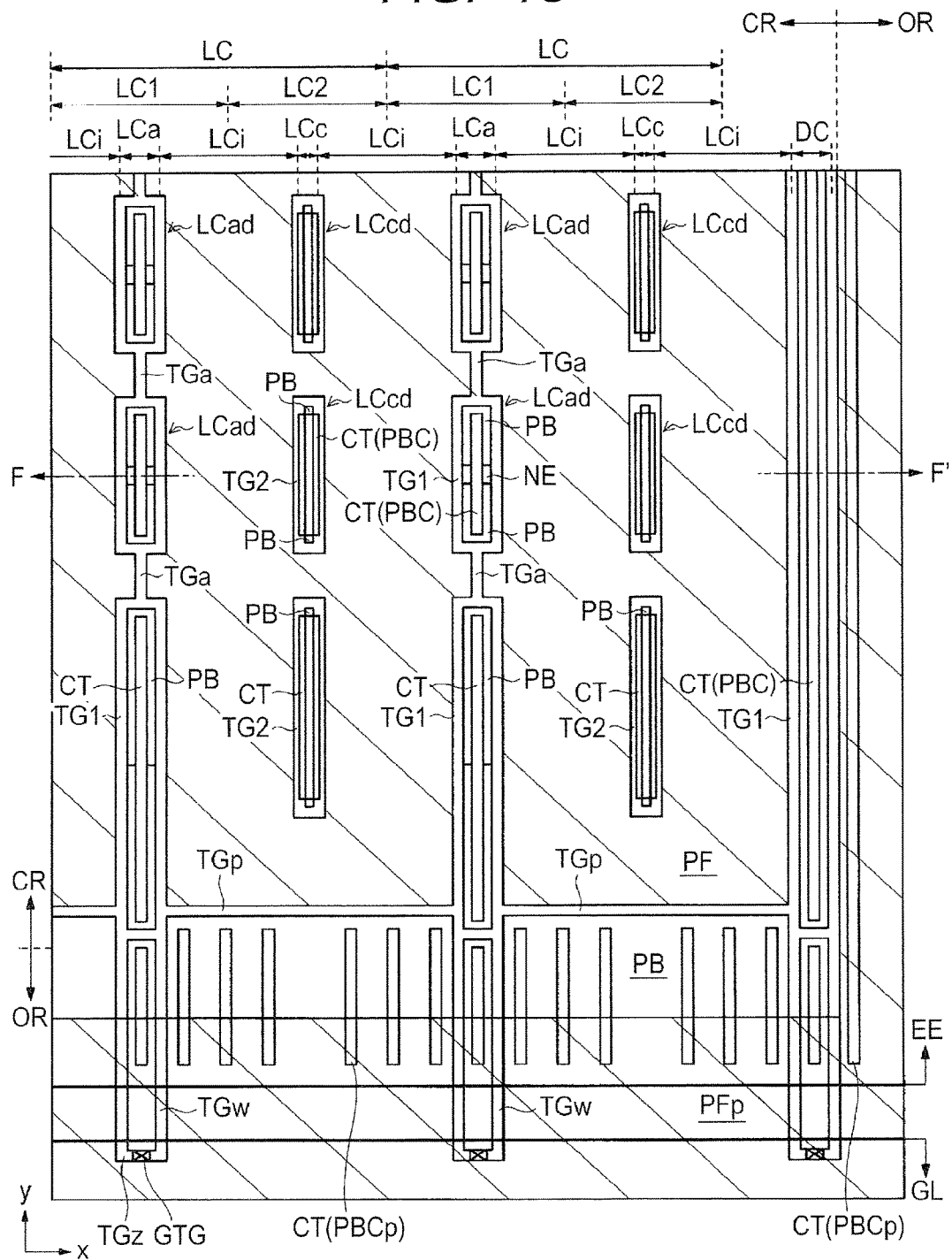
FIG. 15 is a main part plan view showing an enlarged peripheral part (region E illustrated in FIG. 1) of an active part of a semiconductor chip according to an embodiment 4.
Figure 16:
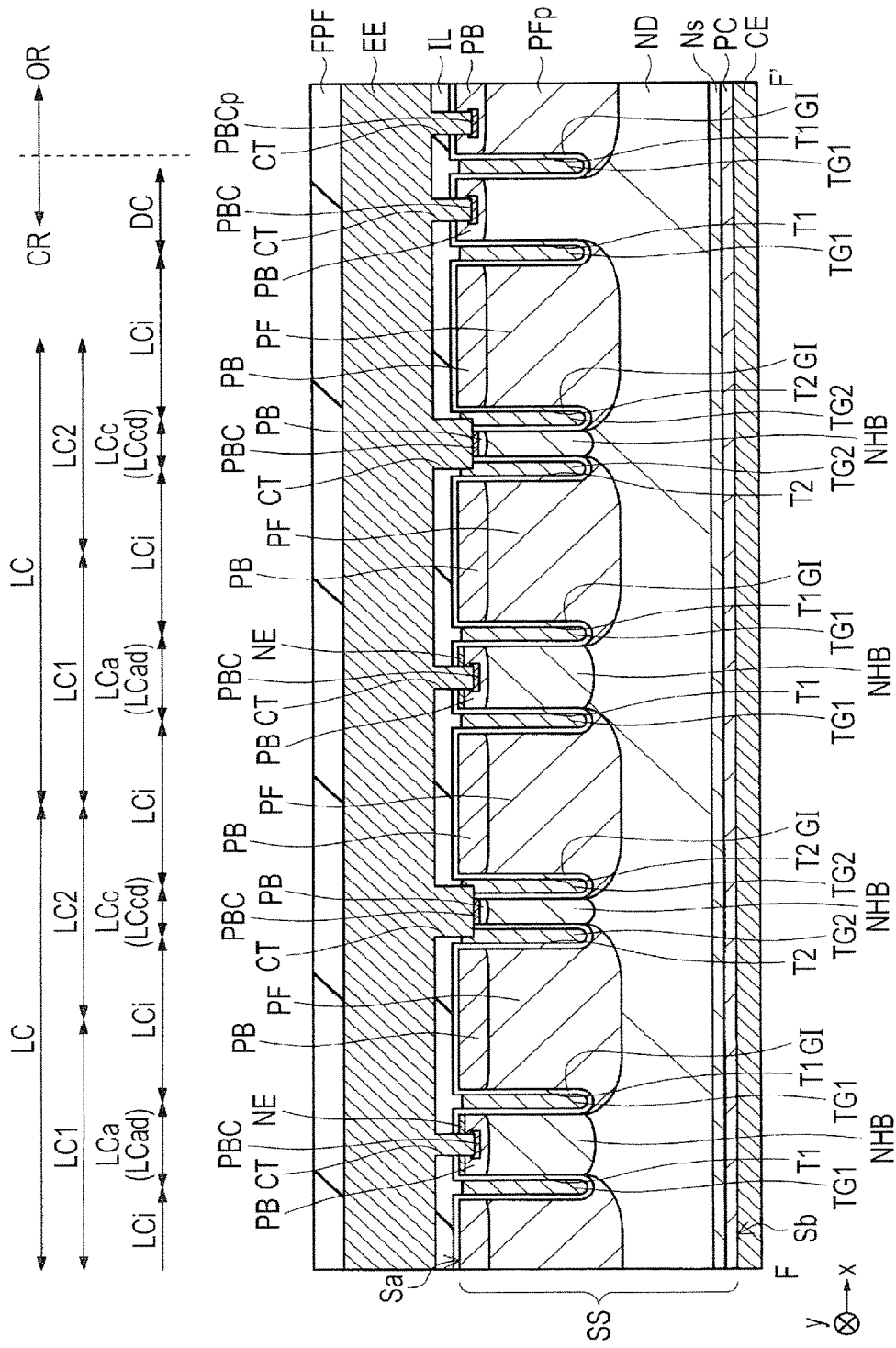
FIG. 16 is a main part cross sectional view part taken along a line F-F' illustrated in FIG. 15.

Descriptions will now be made to a semiconductor device including an IE type trench gate IGBT according to an embodiment 4, using FIG. 15 and FIG. 16. FIG. 15 is a main part plan view showing an enlarged peripheral part (region E illustrated in FIG. 1) of an active part of a semiconductor chip according to an embodiment 4. FIG. 16 is a main part cross sectional view of the IE type trench gate IGBT according to the embodiment 4, and is a main part cross sectional view taken along a line F-F' illustrated in FIG. 15.

Descriptions will now be made to a peripheral structure of a cell region of the IE type trench gate IGBT according to the embodiment 4.

As illustrated in FIG. 15 and FIG. 16, in the end part of a cell region CR, one or a few linear dummy cell regions DC are provided in a width direction (the first direction, x direction) of the linear unit cell region LC. In the linear dummy cell region DC, like the linear active cell region LCa, the P-type body region PB and the P+-type body contact region PBC are formed. However, in the linear dummy region DC, the N+-type emitter region NE and the N-type hole barrier region NHB are not formed. In the linear dummy region DC, the parasitic NPN bipolar does not exist, and the positive hole discharging resistance is low. Thus, a current concentration is not likely to occur, and it functions as an end buffer region.

Even in the end part in the longitudinal direction (second direction, y direction) of the linear unit cell region LC, the N+-type emitter region NE and the N-type hole barrier region NHB are not formed in some region. This region functions as the end buffer region.

In the outer part of the end buffer region, a ring-like cell circumferential junction region OR is provided to surround it. In this cell circumferential junction region OR, the P-type region PFp is provided. This P-type region PFp is formed at the same time in the same process as the P-type floating region PF in the cell region CR. This P-type region PFp is coupled to the emitter potential. That is, it is integrally formed with the P-type region PFp described in FIG. 2 of the above-described embodiment 1.

As illustrated in FIG. 16, the P-type body region PB is provided on the surface Sa of the semiconductor substrate SS in the linear dummy cell region DC and the cell circumferential junction region OR.

In the linear dummy cell region DC, the contact trench CT and the P+-type body contact region PBC are provided. The structure of the linear dummy cell region DC is substantially the same as that of the divided active cell region LCad, except that the N-type hole barrier region NHB and the N+-type emitter region NE are not formed, and that it is not divided in the second direction (y direction).

In the cell circumferential junction region OR, similarly, the contact trench CT and the P+-type body contact region PBCp are provided, and the P-type region PFp is provided below the P-type body region PB.

In the linear dummy cell region DC, there exists the P-type body region PB electrically coupled to the emitter electrode EE, and there is formed a PN junction of the P-type body region PB and the N−-type drift region ND. In the cell circumferential junction region OR, there exists the deep P-type region PFp electrically coupled to the emitter electrode EE, and there is formed a PN junction of the P-type region PFp and the N−-type drift region ND.

In a reverse bias state between the emitter and the collector, the cell final end trench bottom can easily be covered from the right and left sides in a depletion layer of the two junctions. Thus, the local concentration of the field intensity is unlikely to occur. As a result, a withstand voltage between the emitter and the collector does not decrease, due to the cell end structure. The structure of the cell end linear dummy cell is designed in a manner that the positive hole accumulation effect is smaller than in any other parts, and that the on-voltage is high. It is possible to suppress thermal runaway due to current concentration in a part, where and when the IE type trench gate IGBT generates heat, and it is also possible to increase the breakdown resistance as a product.

According to the embodiment 4, it is possible to realize an increase in the breakdown resistance, in addition to the effect of the IE type trench gate IGBT according to the above-described embodiment 1.

Embodiment 5

Figure 17:
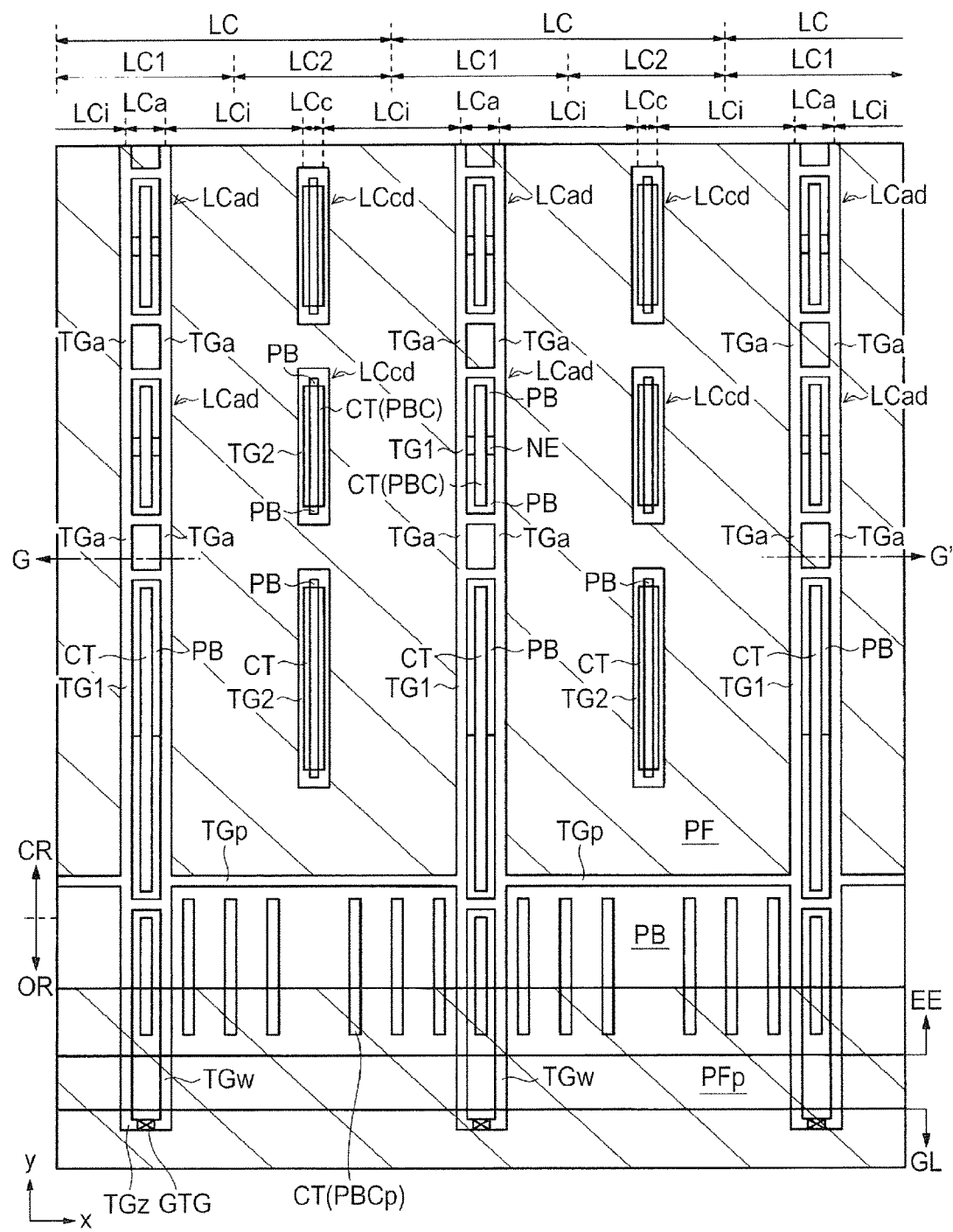
FIG. 17 is a main part plan view showing an enlarged part of an active part of a semiconductor chip according to an embodiment 5.
Figure 18:
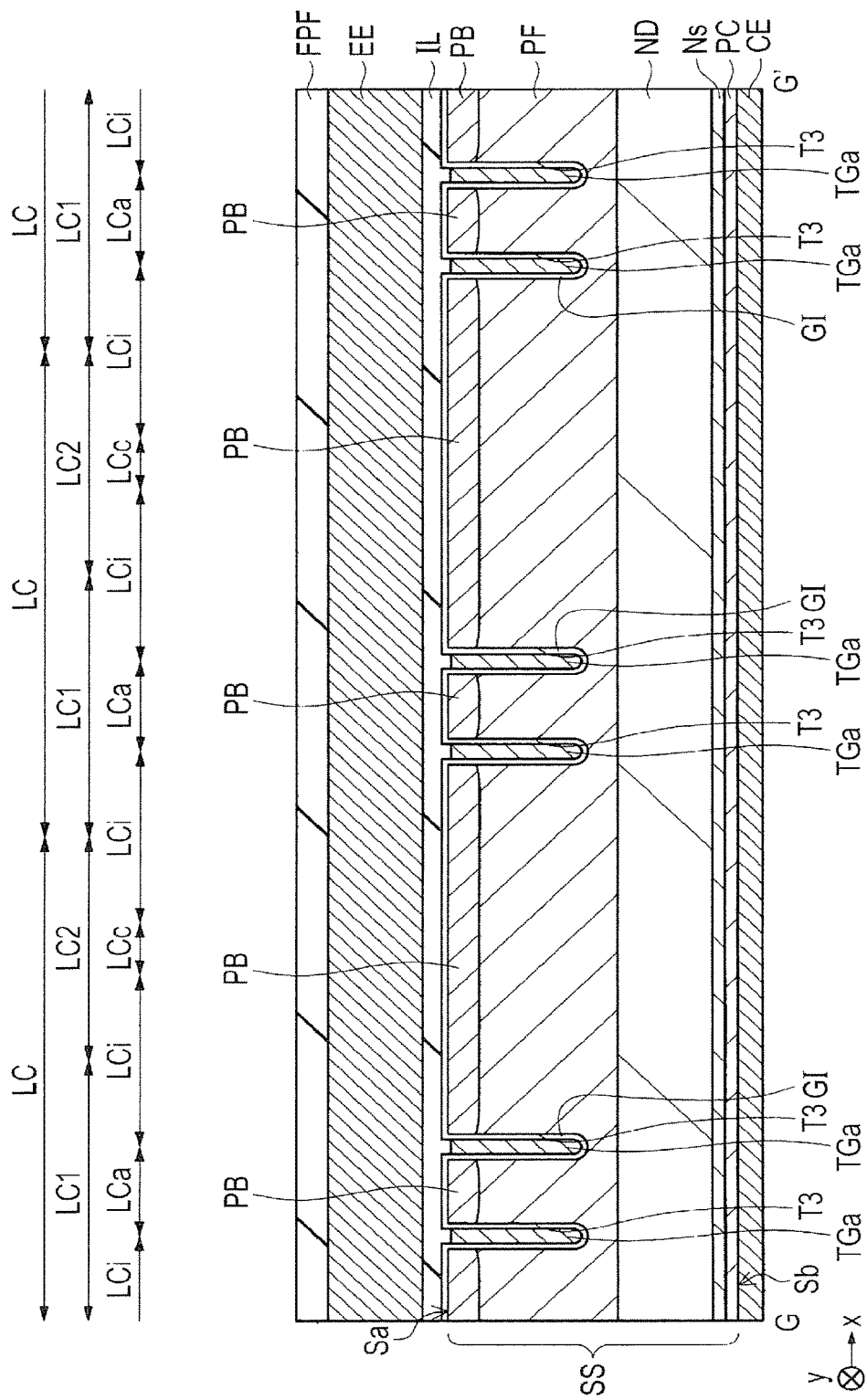
FIG. 18 is a main part cross sectional view taken along a line G-G' illustrated in FIG. 17.

Descriptions will now be made to a semiconductor device including an IE type trench gate IGBT according to an embodiment 5, using FIG. 17 and FIG. 18. FIG. FIG. 17 is a main part plan view showing an enlarged peripheral part of an active part of the semiconductor chip according to an embodiment 5. FIG. 18 is a main part cross sectional view of the IE type trench gate IGBT according to the embodiment 5, and is a main part cross sectional view taken along a line G-G' illustrated in FIG. 17.

As illustrated in FIG. 17 and FIG. 18, in the IE type trench gate IGBT according to the embodiment 5, what differs from the IE type trench gate IGBT according to the above-described embodiment 1 is the number of the coupling trench gate electrodes TGa for coupling the first trench gate electrodes TG1 in the divided active cell regions LCad adjacent to each other in the second direction (y direction), in the linear active cell region LCa.

In the IE type trench gate IGBT according to the above-described embodiment 1, in the linear active cell region LCa, the first trench gate electrodes TG1 of the respective divided active cell regions LCad adjacent to each other in the second direction (y direction) are coupled with each other through one coupling trench gate electrode TGa.

On the other hand, in the IE type trench gate IGBT according to the embodiment 5, in the linear active cell region LCa, the first trench gate electrodes TGa of the respective divided active cell regions LCad adjacent to teach other in the second direction (y direction) are coupled with each other through two coupling trench gate electrodes TGa provided apart from each other in the first direction (x direction).

Specifically, two third trenches T3 are provided on the surface Sa side of the semiconductor substrate SS. At this time, the trenches T3 are coupled to the respective first trenches in the second direction (y direction) between the divided active cell regions LCad adjacent to each other in the second direction (y direction). Inside that, the coupling trench gate electrodes TGa are integrally formed with the respective first trench gate electrodes TG1 through the respective gate insulating films GI. The coupling trench gate electrodes TGa do not function as the gate of the MISFET.

As a result, it is possible to realize a decrease in the resistance of the trench gate electrodes formed of a plurality of first trench gate electrodes TG1 and a plurality of coupling trench gate electrodes TGa, extending in the second direction (y direction). In the embodiment 5, the two coupling trench gate electrodes TGa are provided between the first trench gate electrodes TG1 of the respective divided active cell regions LCad adjacent to each other in the second direction (y direction). However, the number of the coupling trench gate electrodes TGa is not limited to this example.

According to the embodiment 5, it is possible to realize a decrease in the gate resistance, in addition to the effect of the IE type trench gates IGBT according to the above-described embodiment 1.

Embodiment 6

Figure 19:
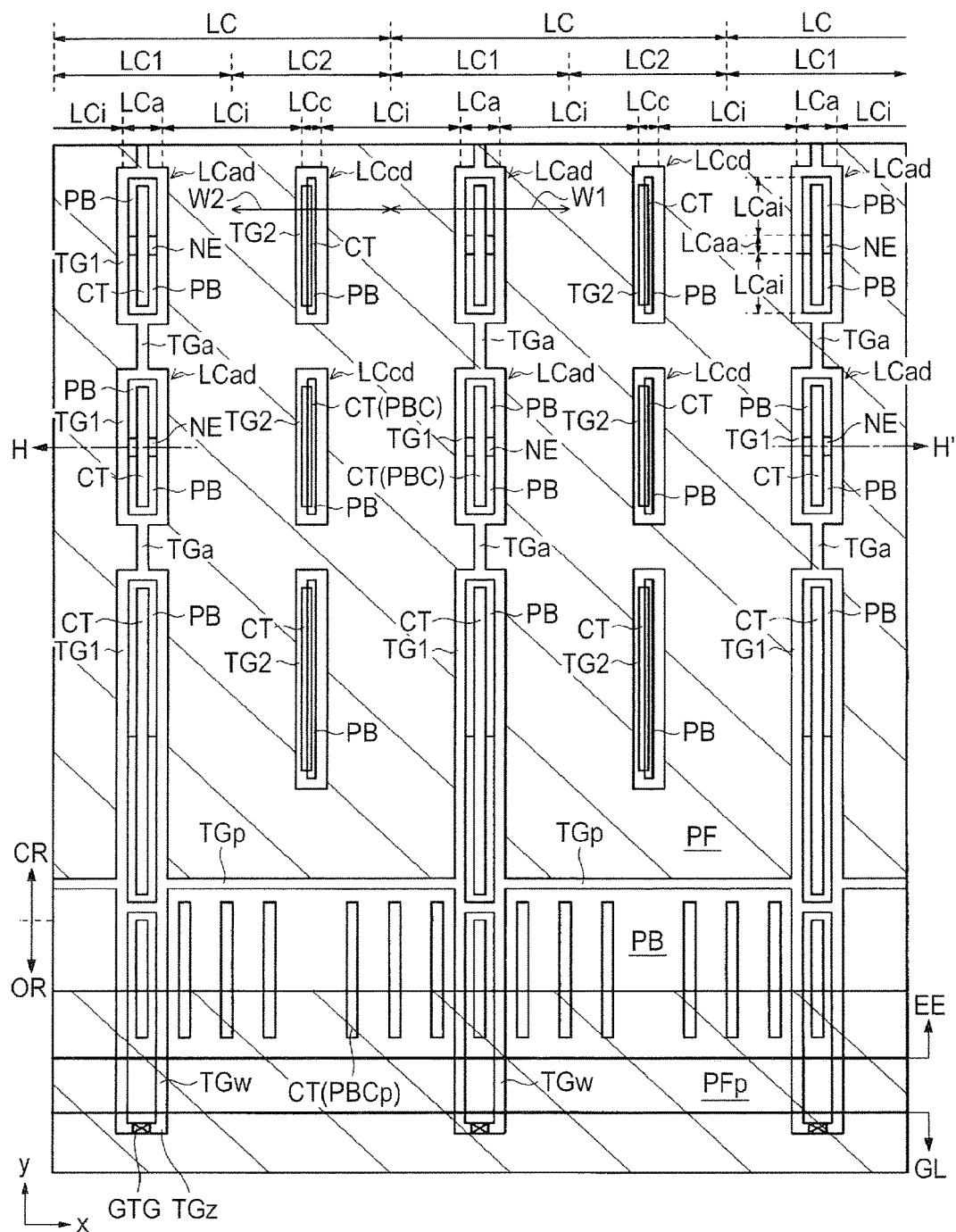
FIG. 19 is a main part plan view showing an enlarged part of an active part of a semiconductor chip according to an embodiment 6.
Figure 20:
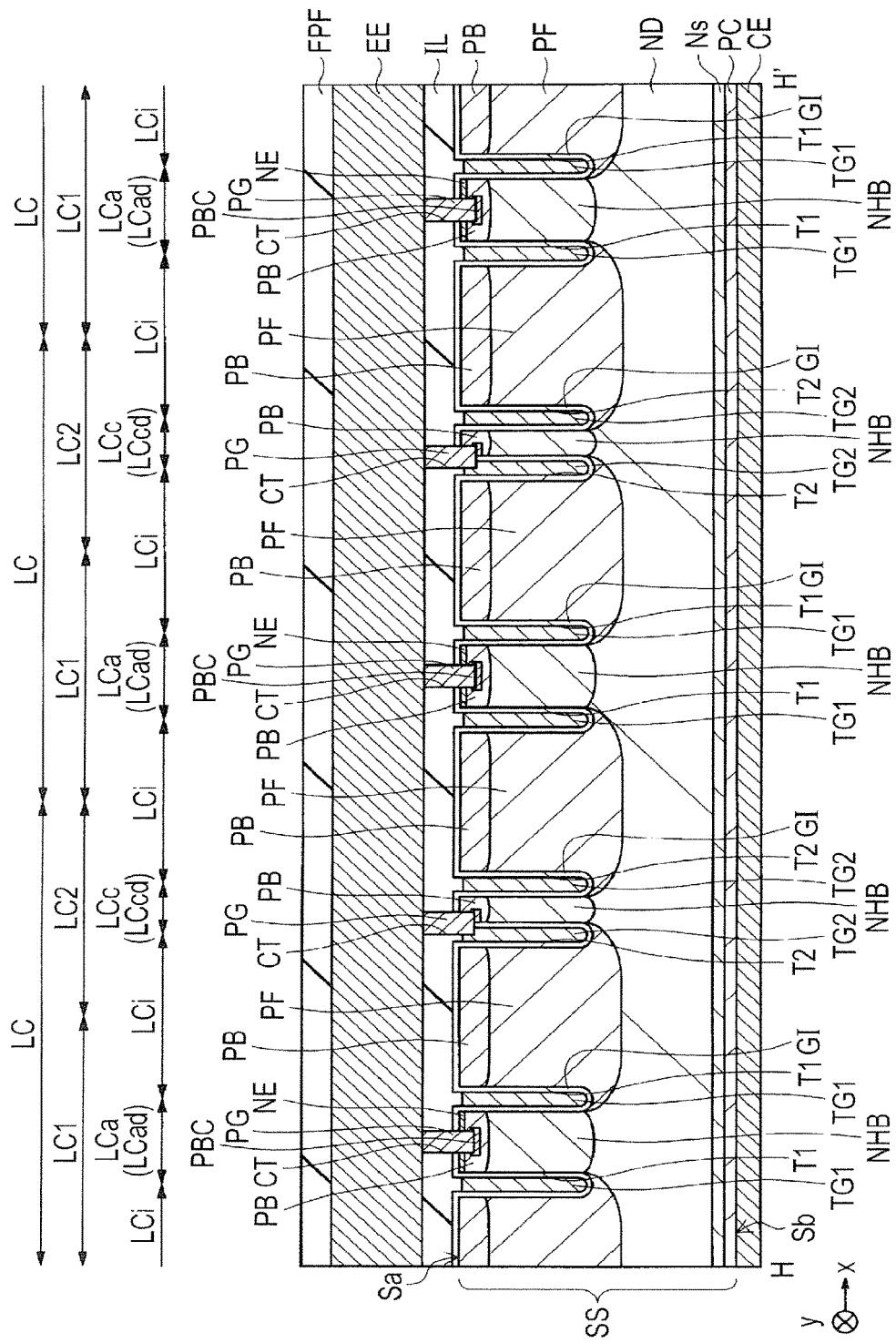
FIG. 20 is a main part cross sectional view taken along a line H-H' illustrated in FIG. 19.

Descriptions will now be made to a semiconductor device including an IE type trench gate IGBT according to an embodiment 6, using FIG. 19 and FIG. 20. FIG. 19 is a main part plan view showing an enlarged part of an active part of a semiconductor chip according to the embodiment 6. FIG. 20 is a main part cross sectional view of the IE type trench gate IGBT according to the embodiment 6, and is a main part cross sectional view taken along a line H-H' illustrated in FIG. 19.

In the above-described embodiment 1, the contact trench CT is formed in a manner that the width Whc of the contact trench CT of the divided hole collector cell region LCcd is greater than the width Wec of the contact trench CT of the divided active cell region LCad (Whc>Wec).

In the embodiment 6, the contact trench CT is formed in a manner that the width Whc of the contact trench CT of the divided hole collector cell region LCcd is approximately the same as the width Wec of the contact trench CT of the divided active cell region LCad. Further, the contact trench CT of the divided hole collector cell region LCcd is arranged to be coupled to the P-type body region PB and one of the second trench gate electrodes TG2 adjacent to each other in the first direction (x direction). Note, in the embodiment 6, that approximately the same width implies a width within a range of a permissible error of 10% or lower with respect to the other width.

As illustrated in FIG. 19, the second trench gate electrodes TG2 of the divided hole collector cell region LCcd are integrated in plan view, and thus has to be coupled to the other second trench gate electrode TG2 in cross section. As a result, it is possible to decrease the width of the contact trench CT, and to reduce the chip area. The second trench gate electrode TG2 is not included in the MISFET, and thus having not effect on the breakdown resistance.

In the embodiment 6, as illustrated in FIG. 20, the contact trench CT is formed in the interlayer insulating film IL, and a plug PG formed of a conductive film is embedded inside the contact trench CT. The plug PG is formed of mainly a conductive film of tungsten. A barrier metal formed of titanium nitride may be formed as a base of the conductive film. The emitter electrode EE coupled to the plug PG is formed over the interlayer insulating film IL.

In the embodiment 6, the plug PG has been used by way of example. However, it is not limited to the example. For example, like any other embodiments, the emitter electrode EE may be embedded directly inside the contact trench CT.

However, when the plug PG is used, a conductive film is formed inside the contact trench CT and over the interlayer insulating film IL, using a CVD (Chemical Vapor Deposition) technique. After this, the conductive film is polished using a CMP (Chemical Mechanical Polishing) technique, and the conductive film is necessarily embedded inside the contact trench CT. At this time, if the contact trenches CT have different widths, the thicknesses of the conductive film embedded inside the contact trenches CT vary depending on the width of the contact trench CT. Thus, it is necessary to form a thick conductive film, in conformity with the contact trench with a large width. However, if the conductive film is formed thick, a polishing amount of the conductive film is large. This results in an excessive amount of polishing, or results in a large variation of the film thickness in the wafer surface.

That is, when the plug PG is used, approximately the same width is preferably given, in conformity with the small width of the contact trench CT. This results in an effect that it is easy to manage the thickness of the conductive films.

The technique disclosed in the embodiment 6 is applicable not only to the above-described embodiment 1, but also to any other embodiments, and the same effect can be realized.

Accordingly, the descriptions have specifically been made to the present invention made by the present inventors. However, needless to say, the present invention is not limited to the above, and various changes may be made without departing from the scope thereof.

What is claimed is:

1. A semiconductor device comprising:
   a semiconductor substrate which has a first principal surface and a second principal surface on an opposite side from the first principal surface; and
   a cell region in which a linear active cell region and a linear hole collector cell region are alternately arranged apart from each other in a first direction, on a side of the first principal surface of the semiconductor substrate, in plan view,
   wherein the linear active cell region is formed of a plurality of divided active cell regions arranged apart from each other in a second direction orthogonal to the first direction,
   wherein each of the divided active cell regions has:
      a first trench having a first depth from the first principal surface and disposed around a periphery of the respective divided active cell region,
      a first trench gate electrode arranged within the first trench via a first gate insulating film,
      a first body region of a first conductivity type having a second depth from the first principal surface in the respective divided active cell region, and
      an emitter region of a second conductivity type different from the first conductivity type and having a third depth from the first principal surface shallower than the second depth, in the respective divided active cell region,
   wherein the linear hole collector cell region is formed of a plurality of divided hole collector cell regions arranged apart from each other in the second direction,
   wherein each of the divided hole collector cell regions has:
      a second trench having a fourth depth from the first principal surface and disposed around a periphery of the respective divided hole collector cell region,
      a second trench gate electrode within the second trench via a second gate insulating film, and
      a second body region of the first conductivity type having a fifth depth from the first principal surface in the respective divided hole collector cell region,
   wherein a floating region of the first conductivity type has a sixth depth from the first principal surface deeper than the second depth and the fifth depth,
   wherein the floating region is provided in the semiconductor substrate between the linear active cell region and the linear hole collector cell region adjacent to each other in the first direction, between the divided active cell regions adjacent to each other in the second direction, and between the divided hole collector cell regions adjacent to each other in the second direction,
   wherein the first body region is surrounded by the first trench, and
   wherein the second body region is surrounded by the second trench.

2. The semiconductor device according to claim 1, further comprising:
   at least one third trench, which extends in the second direction and has a seventh depth from the principal surface, between the divided active cell regions adjacent to each other in the second direction; and
   at least one third trench gate electrode, each third trench gate electrode being arranged within a respective third trench via a third gate insulating film,
   wherein each third trench is coupled to the first trenches of the divided active cell regions positioned respectively on both sides in the second direction of the third trench, and
   wherein each third trench gate electrode is electrically coupled to the first trench gate electrodes of the divided active cell regions positioned respectively on both sides in the second direction of the third trench gate.

3. The semiconductor device according to claim 1,
   wherein the divided active cell regions are positioned on both sides in the first direction of the floating region provided between the divided hole collection cell regions adjacent to each other in the second direction.

4. The semiconductor device according to claim 1,
   wherein a width in the first direction of each divided hole collector cell region is smaller than a width in the first direction of each divided active cell region, and
   wherein a width in the first direction of each divided active cell region is smaller than a distance in the first direction between said divided active cell region and an adjacent one of the plurality of divided hole collector cell regions.

5. The semiconductor device according to claim 1,
   wherein a width in the second direction of the emitter region is larger than a width in the second direction of a region in which the emitter region is not formed.

6. The semiconductor device according to claim 1,
   wherein a width in the first direction of each divided hole collector cell region is smaller than a width in the first direction of each divided active cell region.

7. The semiconductor device according to claim 1,
   wherein the emitter region is not provided in an active cell region at an outermost periphery of the cell region.

8. The semiconductor device according to claim 1,
   wherein an interlayer insulating film is formed over the semiconductor substrate,
   wherein each divided active cell region has an eighth depth deeper than the third depth from the first principal surface, and further has a first contact trench formed in the interlayer insulating film,
   wherein each divided hole collector cell region has a ninth depth from the first principal surface, and further has a second contact trench formed in the interlayer insulating film, and
   wherein a width in the first direction of each second contact trench is approximately the same as a width in the first direction of each first contact trench.

9. The semiconductor device according to claim 8,
   wherein a first plug having a conductive film is formed inside the first contact trench,
   wherein a second plug having the conductive film is formed inside the second contact trench, and
   wherein an emitter electrode coupling to the first plug and the second plug is formed over the interlayer insulating film.

10. The semiconductor device according to claim 1,
    wherein each of the divided active cell regions further has a first contact trench provided with an eighth depth from the principal surface deeper than the third depth,
    wherein each of the divided hole collector cell regions further has a second contact trench provided with a ninth depth from the principal surface,
    wherein a width in the first direction of the first contact trench is smaller than a space over an inside side-surface of the first trenches adjacent to each other in the first direction, wherein a width in the first direction of the second contact trench is larger than a space over an inside side-surface of the second trenches adjacent to each other in the first direction, and wherein a first electrode is embedded inside the first contact trench and inside the second contact trench.

11. The semiconductor device according to claim 10, wherein the width in the first direction of the second contact trench is smaller than a space of an outside side-surface of the second trenches adjacent to each other in the first direction.

12. The semiconductor device according to claim 10, wherein the first electrode, the second trench gate electrode, and the second body region are directly coupled to each other through the second contact trench.

13. The semiconductor device according to claim 10, wherein a pair of second trench gate electrodes adjacent to each other in the first direction extend to a lower end part of the second contact trench.

14. The semiconductor device according to claim 10, wherein the width in the first direction of the second contact trench is larger than the width in the first direction of the first contact trench.

15. The semiconductor device according to claim 10, wherein the first electrode, the emitter electrode, and the first body region are directly coupled to each other through the first contact trench.

* * * * *